US010419247B2

(12) United States Patent
Kamihara et al.

(10) Patent No.: US 10,419,247 B2
(45) Date of Patent: Sep. 17, 2019

(54) TRANSMISSION CIRCUIT, INTEGRATED CIRCUIT DEVICE AND ELECTRONIC DEVICE

(71) Applicant: SEIKO EPSON CORPORATION, Tokyo (JP)

(72) Inventors: Yoshiyuki Kamihara, Okaya (JP); Toshimichi Yamada, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/114,550

(22) Filed: Aug. 28, 2018

(65) Prior Publication Data
US 2019/0068408 A1 Feb. 28, 2019

(30) Foreign Application Priority Data
Aug. 29, 2017 (JP) .................................. 2017-163934

(51) Int. Cl.
*H04L 25/02* (2006.01)
*H03K 19/0175* (2006.01)
*H04L 7/04* (2006.01)
*G06F 13/40* (2006.01)
*H04L 25/03* (2006.01)

(52) U.S. Cl.
CPC ...... *H04L 25/0282* (2013.01); *G06F 13/4072* (2013.01); *H03K 19/0175* (2013.01); *H04L 7/048* (2013.01); *H04L 25/0292* (2013.01); *H04L 25/03* (2013.01)

(58) Field of Classification Search
None
See application file for complete search history.

(56) References Cited

U.S. PATENT DOCUMENTS

| 2005/0057280 A1 | 3/2005 | Groen et al. |
| 2005/0179469 A1* | 8/2005 | Kasanyal ............ H04L 25/0286 327/65 |
| 2012/0019828 A1* | 1/2012 | McCaffrey ........ B01L 3/502707 356/432 |

FOREIGN PATENT DOCUMENTS

| JP | 2006-352374 A | 12/2006 |
| JP | 2007-505575 A | 3/2007 |
| JP | 2010-287035 A | 12/2010 |
| WO | 2005/027442 A1 | 3/2005 |

* cited by examiner

*Primary Examiner* — Jany Richardson
(74) *Attorney, Agent, or Firm* — Oliff PLC

(57) ABSTRACT

A transmission circuit includes a current output circuit that outputs a current to a first node, a first switch element provided between the first node and a first signal line, and a second switch element provided between the first node and a second signal line. When a transmission signal is at a first logic level, the first switch element is ON and the second switch element is OFF. When the transmission signal is at a second logic level, the first switch element is OFF and the second switch element is ON. The current output circuit outputs a second current in an n-bit period after the logic level of the transmission signal is inverted, and outputs a first current after the n-bit period.

15 Claims, 13 Drawing Sheets

TRANSMISSION CIRCUIT, INTEGRATED CIRCUIT DEVICE AND ELECTRONIC DEVICE

BACKGROUND

1. Technical Field

The present invention relates to a transmission circuit, an integrated circuit device, an electronic device, and the like.

2. Related Art

One of the authentication tests defined by the USB standard is an eye pattern test. That is, the USB receptacle of the device that is to be authenticated requires that the eye pattern of the transmission signal does not overlap with a prohibited region. For example, cables (harnesses), additional circuits and additional components lie on the transmission path from the transmission circuit to the USB receptacle, with the resistance or capacitance thereof being factors that degrade the eye pattern. Although it is conceivable to reduce the resistance or capacitance through means such as selection of components, for example, in the case where the cable is long, for example, the capacitance of the cable is greatly affected, making it difficult to improve the characteristics of the eye pattern. As active techniques for improving the characteristics of the eye pattern, there is, for example, a technique for increasing the drive current (transmission current) of the transmission circuit, a technique for shortening the Tr/Tf (transition time of signal level of the transmission signal) of the transmission circuit, and a technique that involves lowering the resistance value of HS termination (termination resistance of the bus in HS mode).

A known technology for a type of differential current driver that increases the drive current, for example, is disclosed in JP-T-2007-505575. This known technology involves increasing the drive current in the initial 1-bit period after the logic level (signal level) of the transmission signal is inverted. With this differential current driver, a driver for normal driving that drives the bus with a normal current when not increasing the current and a driver for preemphasis that outputs an increased amount of current in the above 1-bit period are provided in parallel to the bus.

With a technique for improving the characteristics of the eye pattern by increasing the drive current such as the above, the relationship between the timing at which the logic level of the transmission signal changes and the timing at which the drive current changes will possibly affect the quality of the transmission signal (e.g., edge timing jitter, etc.). For example, with a technique that provides two drivers in parallel such as JP-T-2007-505575, there is the timing at which transistors for the positive side and the negative side of the driver for normal driving switch ON and OFF and the timing at which transistors for the positive side and the negative side of the driver for preemphasis switch ON and OFF. There are thus (2×2=) four timing relationships that need to be taken into consideration, and timing adjustment could possibly become complicated.

SUMMARY

An advantage of some aspects of the invention is being able to provide a transmission circuit, an integrated circuit device, an electronic device and the like that can improve the characteristics of an eye pattern while reducing adverse effects on the quality of a transmission signal.

One aspect of the invention relates to a transmission circuit for transmitting a transmission signal via a first signal line and a second signal line that constitute a differential signal line, including a current output circuit configured to output a current to a first node, a first switch element provided between the first node and the first signal line, and a second switch element provided between the first node and the second signal line. When the transmission signal is at a first logic level, the first switch element is ON, the second switch element is OFF, and the first signal line is driven by the current from the current output circuit, and when the transmission signal is at a second logic level, the first switch element is OFF, the second switch element is ON, and the second signal line is driven by the current from the current output circuit. In an n-bit period (where n is an integer greater than or equal to 1) after a logic level of the transmission signal is inverted, the current output circuit outputs a second current that is larger than a first current as the current, and in a period until the logic level is next inverted after the n-bit period, the current output circuit outputs the first current as the current.

According to one aspect of the invention, a drive current for driving a differential signal line can be increased, in an n-bit period after the logic level of the transmission signal is inverted. The difference between the amplitude of the transmission signal in the n-bit period after the logic level of the transmission signal is inverted and the amplitude of the transmission signal after the n-bit period is thereby reduced, enabling the characteristics of the eye pattern to be improved. Also, according to one aspect of the invention, the current from the current output circuit is output to the first and second signal lines via the first and second switch elements. The number of switch timing relationships that affect the relationship between the timing at which the logic level of the transmission signal changes and the timing at which the drive current changes is thus (1×2=) two. That is, the first relationship is the relationship between the timing at which the current output circuit switches from the first current to the second current and the timing at which the first switch element is switched from OFF to ON. The second relationship is the relationship between the timing at which the current output circuit switches from the first current to the second current and the timing at which the second switch element is switched from OFF to ON. In this way, simplification of the timing adjustment can be achieved, since there are two timing relationships to be taken into consideration. As mentioned above, according to one aspect of the invention, the characteristics of the eye pattern can be improved while reducing adverse effects on the quality of the transmission signal due to simplification of the timing adjustment.

Also, in one aspect of the invention, the current output circuit may have a first current source configured to output the first current to the first node, a second current source configured to output a third current to a second node, and a third switch element provided between the first node and the second node.

By adopting this configuration, the first current is output to the first node when the third switch element is OFF, and the first current and the third current are output to the first node when the third switch element is ON. Accordingly, it becomes possible for the current output circuit to output a second current that is larger than the first current.

Also, in one aspect of the invention, the third switch element may be ON in the n-bit period, and the second current may be a current obtained by adding the third current to the first current.

By adopting this configuration, the current output circuit becomes able to output a second current that is larger than the first current, in the n-bit period after the logic level of the transmission signal is inverted.

Also, in one aspect of the invention, the transmission circuit may include a first driver configured to drive ON and OFF of the first switch element, a first drive wiring connecting the first driver and the first switch element, a second driver configured to drive ON and OFF of the second switch element, a second drive wiring connecting the second driver and the second switch element, a third driver configured to drive ON and OFF of the third switch element, and a third drive wiring connecting the third driver and the third switch element. Also, the third drive wiring may be greater than or equal in length to the first drive wiring and the second drive wiring.

By adopting this configuration, the signal delay caused by parasitic resistance or parasitic capacitance of the third drive wiring will be greater than or equal to the signal delay caused by parasitic resistance or parasitic capacitance of the first and second drive wirings. The timing at which the third switch element switches from OFF to ON can thus be shifted to on or after the timing at which the first and second switch elements switch from OFF to ON. Because the timing at which the current that is output from the current output circuit changes from the first current to the second current will be on or after the timing at which the logic level of the transmission signal is inverted, the influence on the quality of the transmission signal is reduced.

Also, in one aspect of the invention, the transmission circuit may include a first current wiring connected at one end to the first current source, and a second current wiring connected at one end to the third switch element and connected at the other end to the other end of the first current wiring. Also, the first current wiring may be greater in length than the second current wiring.

By adopting this configuration, the signal delay on the second current wiring (time taken for the parasitic capacitance of the wiring to be charged by current) will be greater than or equal to the signal delay on the first current wiring. The timing at which the signal (current) reaches the other end of the second current wiring from the third switch element after the third switch element switches from OFF to ON can thus be shifted to on or after the timing at which the signal (current) reaches the other end of the first current wiring from the first current source after the first and second switch elements switch from OFF to ON. Because the timing at which the current that is output from the current output circuit changes from the first current to the second current will thereby be on or after the timing at which the logic level of the transmission signal is inverted, the influence on the quality of the transmission signal is reduced.

In one aspect of the invention, the transmission circuit may include a first driver having a first ON-drive transistor configured to drive the first switch element from OFF to ON and a first OFF-drive transistor configured to drive the first switch element from ON to OFF, a second driver having a second ON-drive transistor configured to drive the second switch element from OFF to ON and a second OFF-drive transistor configured to drive the second switch element from ON to OFF, and a third driver having a third ON-drive transistor configured to drive the third switch element from OFF to ON and a third OFF-drive transistor configured to drive the third switch element from ON to OFF. Also, the third ON-drive transistor may be smaller in size than the first ON-drive transistor and the second ON-drive transistor.

By adopting this configuration, the drive capability of the third ON-drive transistor will be less than or equal to the drive capability of the first and second ON-drive transistors. The timing at which the third switch element switches from OFF to ON can thus be shifted to on or after the timing at which the first and second switch elements switch from OFF to ON. Because the timing at which the current that is output from the current output circuit changes from the first current to the second current will thereby be on or after the timing at which the logic level of the transmission signal is inverted, the influence on the quality of the transmission signal is reduced.

Also, in one aspect of the invention, the current output circuit may have a first current source configured to output the second current to the first node, a third switch element provided between the first node and the second node, and a second current source configured to send a third current from the second node to the third node.

By adopting this configuration, when the third switch element is ON, the second current is output to the first node and the third current flows to the third node from the first node. When the third switch element is OFF, the second current is output to the first node. Accordingly, the current output circuit will be able to output a second current that is larger than the first current.

Also, in one aspect of the invention, the third switch element may be ON in a period until the logic level is next inverted after the n-bit period, and the first current may be a current obtained by subtracting the third current from the second current.

By adopting this configuration, the current output circuit will be able to output a second current that is larger than the first current, in the n-bit period after the logic level of the transmission signal is inverted.

Also, in one aspect of the invention, the transmission circuit may be configured such that n=1.

It is assumed that, after the logic level of the transmission signal is inverted, a large change in the signal level of the transmission signal occurs in the initial 1-bit period. It is thus thought that amplitude jitter in the eye pattern can be sufficiently reduced by increasing the drive current in the 1-bit period after the logic level of the transmission signal is inverted.

Also, in one aspect of the invention, the differential signal line may be a differential signal line of a bus compliant with a USB (Universal Serial Bus) standard.

In the case where the bus that is connected to the transmission circuit is USB, the transmission circuit and the USB receptacle are connected by a cable, a harness or the like, for example. Various cables and harnesses can be employed for such a connection, and thus the characteristics of the eye pattern of the transmission signal may be affected by the capacitance or the like of the cable or harness. According to one aspect of the invention, the characteristics of the eye pattern of the transmission signal can be improved, by increasing the drive current in the n-bit period after the logic level of the transmission signal is inverted.

Also, in one aspect of the invention, the transmission circuit may be a transmission circuit for HS (High Speed) mode of the USB standard.

In HS mode of the USB standard, the NRZI scheme and the bit-stuffing scheme are employed in encoding transmission signals. With these schemes, when a reception signal is decoded to generate reception data, and the reception data is encoded to generate a transmission signal, the reception signal and the transmission signal will be the same signal (signals corresponding to the same bit sequence). The timing at which the logic level of the transmission signal is inverted can thus be judged from the bit sequence of reception data. Accordingly, when a reception signal is decoded to generate reception data in packet analysis or the like, it becomes possible to generate a control signal from the reception data.

Also, another aspect of the invention relates to an integrated circuit device that includes the transmission circuit described in any of the above.

Also, in another aspect of the invention, the transmission circuit may include a first physical layer circuit to which a first bus compliant with the USB standard is connected, a second physical layer circuit having the transmission circuit and to which a second bus compliant with the USB standard and constituted by the differential signal line is connected, and a processing circuit configured to perform transfer processing for transmitting a packet received from the first bus via the first physical layer circuit to the second bus via the second physical layer circuit. Also, the processing circuit may have a transfer control circuit configured to perform packet analysis of the packet and control the transfer processing based on a result of the packet analysis, and the transfer control circuit, in the packet analysis, may decode a reception signal from the first bus to acquire reception data, and generate, from the reception data, a control signal for causing the current output circuit to output the second current in the n-bit period.

In HS mode of the USB standard, the NRZI scheme and the bit-stuffing scheme are employed as the encoding scheme. With these schemes, data uniquely corresponds to the signal obtained by encoding the data, and thus the reception signal and the transmission signal will be the same signal (signals corresponding to the same bit sequence). It is thus possible to find out the position (bit) at which the logic level of the transmission signal will be inverted from the reception data obtained by decoding the reception signal. Accordingly, it becomes possible to generate the control signal from the reception data.

Also, in another aspect of the invention, the transmission circuit may include a physical layer circuit having the transmission circuit and to which a bus compliant with the USB standard and constituted by the differential signal line is connected, and a processing circuit configured to transmit a packet to the bus via the physical layer circuit. Also, the processing circuit may have a transmission control circuit configured to encode transmission data and transmit a transmission signal obtained from the encoding to the bus via the physical layer circuit, and the transmission control circuit may generate, from the transmission data, a control signal for causing the current output circuit to output the second current in the n-bit period.

With the encoding scheme (NRZI scheme and bit-stuffing scheme) that is employed in HS mode of the USB standard, data uniquely corresponds to the signal obtained by encoding the data. It is thus possible to find out the position (bit) at which the logic level of the transmission signal will be inverted from the transmission data. Accordingly, it is possible to generate the control signal from the transmission data.

Also, a further aspect of the invention relates to an electronic device that includes the transmission circuit described in any of the above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail. Note that the embodiments that are described below are not intended to unduly limit the contents of the invention as defined in the claims, and not all combinations of the configurations that are described in the embodiments are essential to means for solving the problems addressed by the invention.

1. Transmission Circuit

Figure 1:
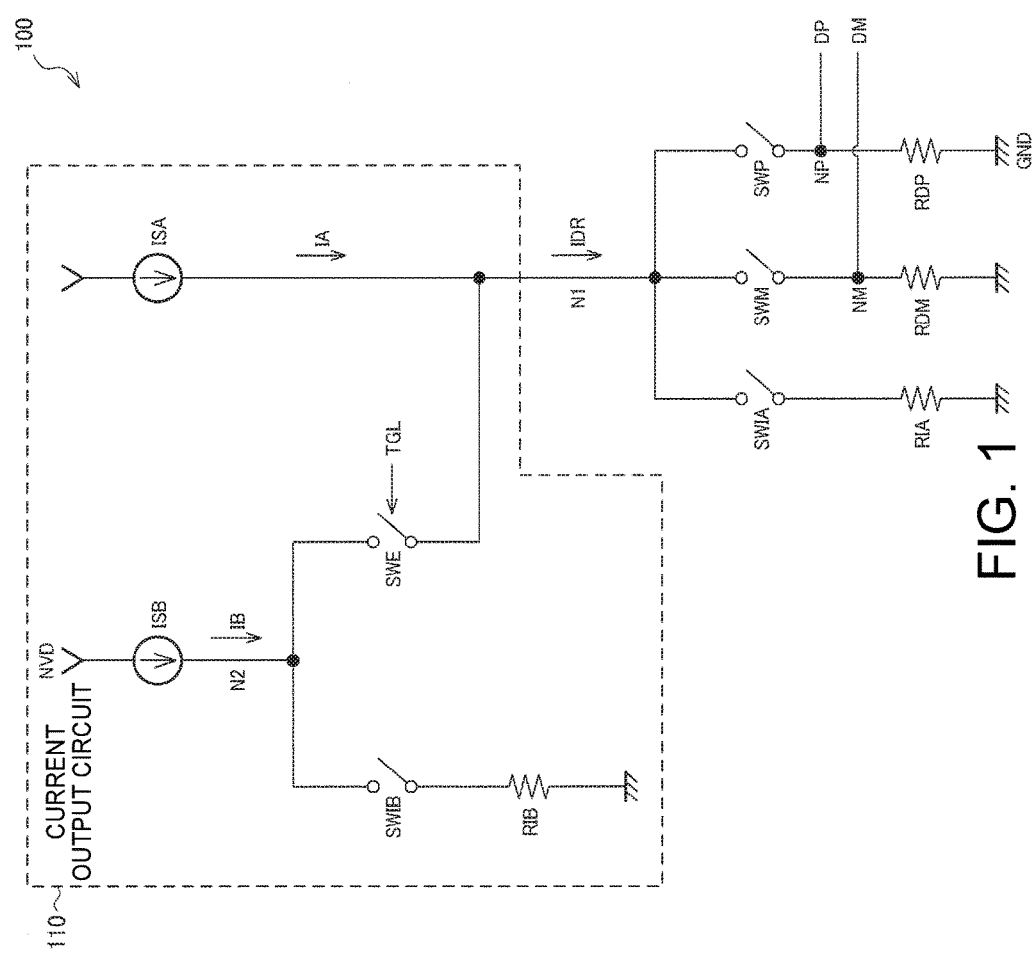
FIG. 1 shows an exemplary configuration of a transmission circuit of an embodiment.

FIG. 1 shows an exemplary configuration of a transmission circuit of the present embodiment. The transmission circuit 100 includes a current output circuit 110, switch elements SWIA, SWM and SWP (switches), and resistors RIA, RDM and RDP (resistive elements). The current output circuit 110 includes current sources ISA and ISB (current source circuits), switch elements SWE and SWIB (switches), and a resistor RIB (resistive element). Note that the transmission circuit is not limited to the configuration in FIG. 1, and implementation of various modifications is possible, such as omitting some of the constituent elements (e.g., switch elements SWIA and SWIB, resistors RIA and RIB), or adding other constituent elements.

The transmission circuit 100 is a transmission circuit that is included in a physical layer circuit to which a bus compliant with a given serial communication standard is connected. The transmission circuit 100 outputs a transmission signal to a reception-side device (external device) that is connected to the bus, and uses the transmission signal to transmit packets conforming to the given serial communication standard, for example, to the reception-side device. Note that although the case where the given serial communication standard is the USB standard (HS mode) will be described below as an example, application of the invention is not limited to the USB standard. That is, the given serial communication standard need only be a serial communication standard for outputting a transmission signal by driving a bus with current. More specifically, the given serial communication standard need only be a serial communication standard in which the frequency of the transmission signal and the operating clock frequency of the reception-side device are asynchronous, and SYNC (synchronous signal) for receiving packets in synchronization with the frequency of the transmission signal, without separately transmitting a clock signal in addition to the packets (data), is assigned to the head of the packets.

The bus to which the transmission circuit 100 is connected is a bus that includes a first signal line and a second signal line that constitute a differential signal line. The differential signal line is a signal line of a first signal DP and a second signal DM that constitute a differential signal. Note that the bus can further include signal lines of power supplies VBUS and GND.

The switch element SWP and resistor RDP are connected in series to a node N1 and a power supply node GND (low potential-side power supply node; e.g., grand node). A node NP between the switch element SWP and resistor RDP is connected to the first signal line. The switch element SWM and the resistor RDM are connected in series to the node N1 and the power supply node GND. A node NM between the switch element SWM and the resistor RDM is connected to the second signal line. The switch element SWIA and the resistor RDA are connected in series to the node N1 and the power supply node GND. The switch elements SWP, SWN, and SWIA are constituted by transistors, such as N-type transistors, for example. Note that other circuit elements (e.g., transistors, resistors, etc.) may be further provided between the node N1 and the switch element SWP. Similarly, other circuit elements may be further provided between the node N1 and the switch element SWM.

When the switch element SWP is ON, the switch element SWM and switch element SWIA are OFF, and a current IDR that is output to the node N1 by the current output circuit 110 is output to the node NP. Also, when the switch element SWM is ON, the switch element SWP and switch element SWIA are OFF, and the current IDR is output to the node NM. The resistors RDP and RDM are termination resistors and similar termination resistors are also provided in the reception circuit of the reception-side device. The current IDR output to the nodes NP and NM will undergo current-to-voltage conversion using the termination resistors on the transmission-side and the reception-side, and the transmission signals (signals DP and DM) of the differential voltage signals will be output to the bus. When the switch element SWP is ON and the switch element SWM is OFF, the signal DP is high level and the signal DM is low level. The differential transmission signal at this time is high level (first logic level). On the other hand, when the switch element SWP is OFF and the switch element SWM is ON, the signal DP is low level and the signal DM is high level. The transmission signal of this time differential is low level (the second logic level).

The switch element SWIA is OFF when either of the switch elements SWP and SWM is ON, and the switch element SWIA is ON when both the switch elements SWP and SWM are OFF. Thus, even during a period in which the transmission signal is not output, the path through which the current IDR that is output by the current output circuit 110 flows is secured, enabling stabilization of the operations of the current output circuit 110 to be achieved.

The current source ISA of the current output circuit 110 outputs a current IA to the node N1. The current source ISB outputs a current IB to a node N2. Here, the currents IA and IB are currents having a positive current value, and IA>IB. For example, the current IB is greater than zero and less than or equal to half of the current IA. The current sources ISA and ISB are constituted by current mirror circuits or the like, for example. The switch element SWE is provided between the node N2 and the node N1. The switch element SWIB is connected in series between the node N2 and the power supply node GND. The switch elements SWE and SWIB are constituted by a transistor, such as N-type transistor, for example.

The switch element SWE is controlled to be ON or OFF by a control signal TGL (toggle control signal, toggle bit), and is ON in the n-bit period (where n is an integer greater than or equal to 1) after the switch element SWP or the switch element SWM switches from OFF to ON. In other periods, the switch element SWE is OFF. n may be fixed or may be variably set by a register setting or the like, for example. The current IDR is IA+IB when the switch element SWE is ON, and the current IDR is IA when the switch element SWE is OFF. That is, the current IDR increases in the n-bit period (drive current is enhanced). By increasing the drive current in this way, the characteristics (amplitude jitter of the transmission signal) of the eye pattern can be improved as will be discussed later.

Here, the n-bit period is a period in which a transmission signal corresponding to n bits of serial data is output. For example, the 1-bit period is a period in which a low level or high level transmission signal is output in correspondence with a "0" or "1" bit. In HS mode of USB, a signal in which DP is low level and DM is high level is called "K", a signal in which DP is high level and DM is low level is called "J". "K" corresponds to a "0" bit and "J" corresponds to a "1" bit.

The switch element SWIB is OFF when the switch element SWE is ON, and is ON when the switch element SWE is OFF. Thus, even in periods in which the drive current is not increased (periods other than the n-bit period), the path through which the current IB that is output by the current source ISB flows is secured, and stabilization of the operations of the current source ISB can be achieved.

Note that the current output circuit 110 may be configured such that the current IB can be variably set. For example, assume that the current source ISB is constituted by current sources ISBa to ISBc, and the switch element SWE is constituted by switch elements SWEa to SWEc. In this case, the current source ISBa and the switch element SWEa are connected in series between a power supply node NVD (high potential-side power supply node) and the node N1, the current source ISBb and the switch element SWEb are connected in series between the power supply node NVD and the node N1, and the current source ISBc and the switch element SWEc are connected in series between the power supply node NVD and the node N1. The current IB is then variably set, by selecting one or a plurality of switch elements from among the switch elements SWEa to SWEc (e.g., by register setting, etc.). The switch elements that are not selected are OFF, and ON and OFF of the selected switch element is controlled by the control signal TGL.

Figure 2:
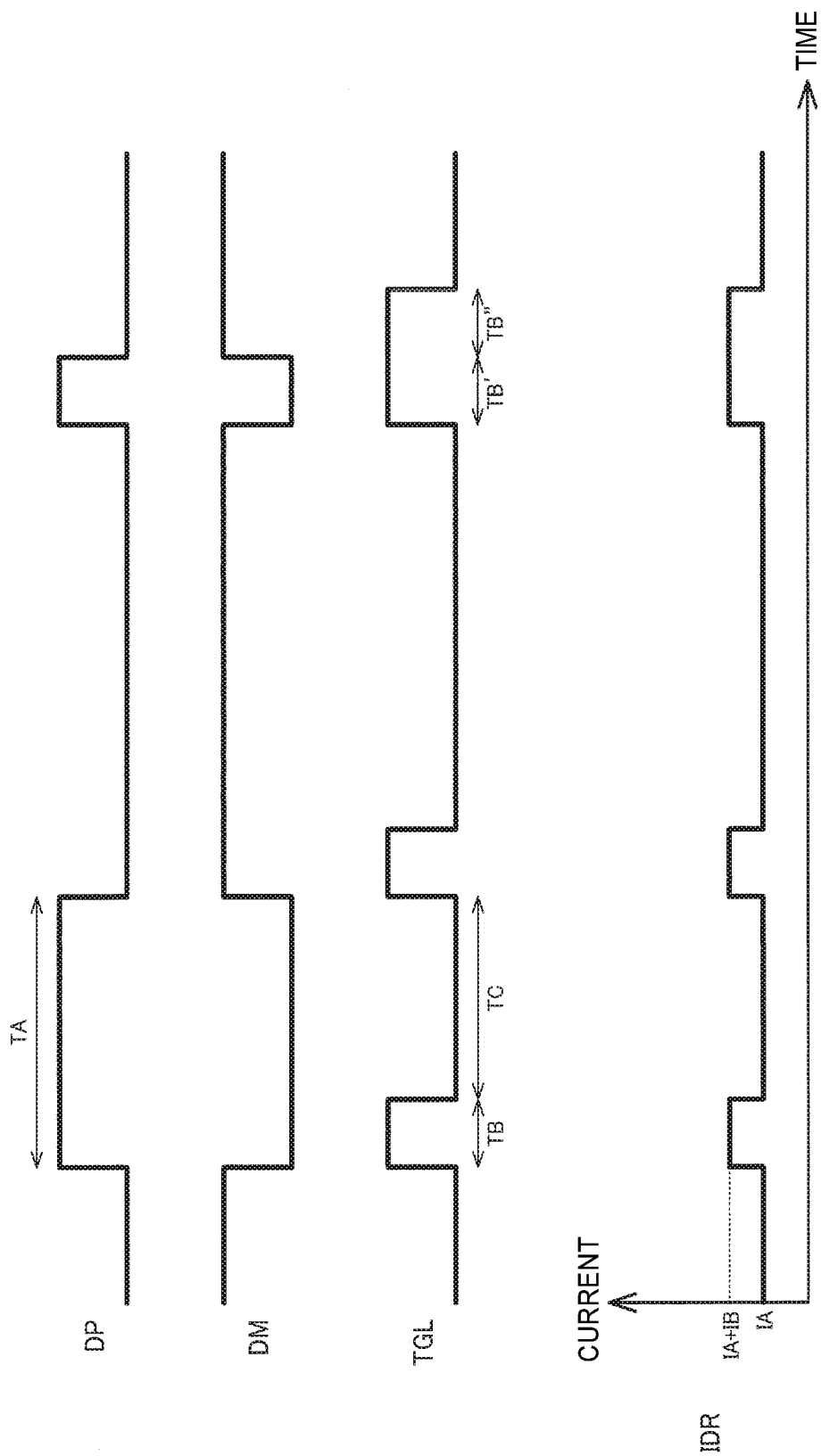
FIG. 2 is a timing chart illustrating operations of the transmission circuit of the embodiment.

FIG. 2 is a timing chart illustrating operations of the transmission circuit of the present embodiment. Note that although FIG. 2 illustrates the case where n=1 as an example, n is not limited to 1. For example, with USB, the maximum period for a transmission signal of the same logic level using bit stuffing is a 7-bit period. In this case, n is an integer from 1 to 6 inclusive.

When the switch element SWP switches from OFF to ON and the switch element SWM switches from ON to OFF, the signal DP transitions from low level to high level and the signal DM transitions from high level to low level. In a 1-bit period TB from the edge of the signals DP and DM, the control signal TGL is active (high level) and the switch element SWE is ON. In this 1-bit period TB, current IDR=IA+IB and the drive current is in an increased state from a period TC.

In the period TC until the next edge of the signals DP and DM after the 1-bit period TB, the control signal TGL is inactive (low level) and the switch element SWE is OFF. In FIG. 2, the signals DP and DM are respectively high level and low level in the 4-bit period TA. In this case, the period TC is a 3-bit period. In this period TC, current IDR=IA and the drive current is normal. The current value of this current IA is the current value of the drive current defined in the USB standard, for example.

When the switch element SWP switches from ON to OFF and the switch element SWM switches from OFF to ON, the signal DP transitions from high level to low level and the signal DM transitions from low level to high level. Even in the 1-bit period from the edge of the signals DP and DM, the control signal TGL is active (high level), the switch element SWE is ON, and the drive current is in an increased state.

In the case where the period from one edge of the signals DP and DM to the next edge is a 1-bit period TB', the next 1-bit period TB" also corresponds to a 1-bit period from the edge of the signals DP and DM. Thus, the drive current is formally in an increased state in a 2-bit period (TB'+TB").

Note that although the case where the signals DP and DM are exclusively high level and low level is illustrated in FIG. 2, there are cases where the signals DP and DM are both low level. In this case, in the 1-bit period from the edge after one of the signals DP and DM has transitioned from low level to high level, the control signal TGL is active, the switch element SWE is ON, and the drive current is in an increased state.

The transmission circuit 100 of the above present embodiment is a transmission circuit that transmits transmission signals (DP, DM) via a first signal line (signal line for DP) and a second signal line (signal line for DM) that constitute a differential signal line. The transmission circuit 100 includes the current output circuit 110 that outputs the current IDR to the first node N1, a first switch element SWP that is provided between the first node N1 and the first signal line, and a second switch element SWM that is provided between the first node N1 and the second signal line. When the transmission signal is the first logic level (high level), the first switch element SWP is ON, the second switch element SWM is OFF, and the first signal line (signal line of DP) is driven by the current IDR from the current output circuit 110. When the transmission signal is the second logic level (low level), the first switch element SWP is OFF, the second switch element SWM is ON, and the second signal line (signal line of DM) is driven by the current IDR from the current output circuit 110. In the n-bit period after the logic level of the transmission signal is inverted (TB of FIG. 2; n is an integer greater than or equal to 1), the current output circuit 110 then outputs a second current (IA+IB) that is larger than the first current IA as the current IDR. In the period after the n-bit period until the logic level is next inverted (TC in FIG. 2), the current output circuit 110 outputs the first current IA as the current IDR.

Adopting such a configuration enables the drive current for driving the differential signal line to be increased, in the n-bit period after the logic level of the transmission signal is inverted. The characteristics of the eye pattern can thereby be improved. This point will be described using FIG. 3 and FIG. 4. Note that although n=1 below, n is not limited to 1.

Figure 3:
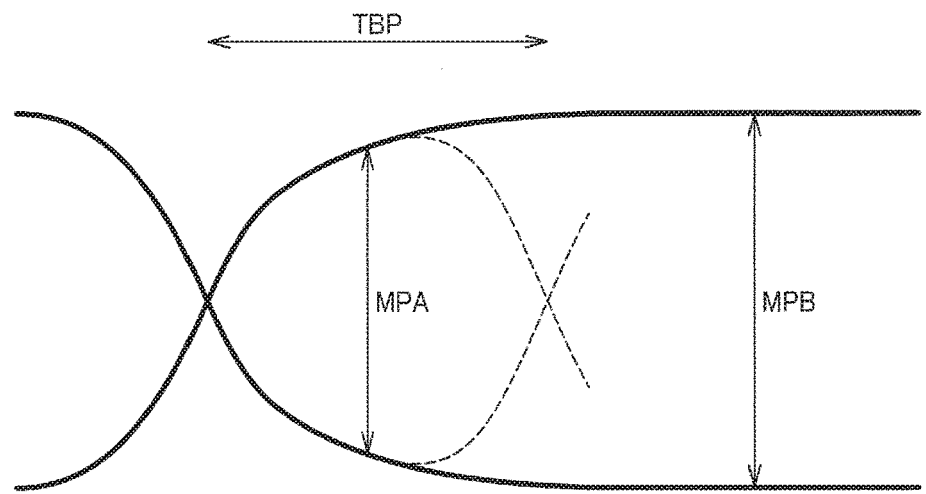
FIG. 3 shows an exemplary waveform of a transmission signal in the case where the drive current is not increased.

An exemplary waveform of the transmission signal in the case where the drive current is not increased is shown in FIG. 3. Because the capacitance of the cable of the bus (differential signal line) and the like is charged by the drive current when the logic level of the transmission signal is inverted, the signal level transitions gently. Thus, in the case where, for example, the capacitance of the cable or the like is large, there is a possibility that the transmission signal will not reach a peak magnitude MPB, in the initial 1-bit period TBP after the logic level of the transmission signal is inverted. In the case where the logic level of the transmission signal is inverted again after the 1-bit period TBP (indicated with dotted lines), an amplitude MPA of that transmission signal is smaller than the peak magnitude MPB, and if the logic level of the transmission signal is maintained even after the 1-bit period TBP, the transmission signal reaches the peak magnitude MPB. The difference in the amplitudes MPA and MPB becomes amplitude jitter (variation or fluctuation in amplitude) in the eye pattern.

Figure 4:
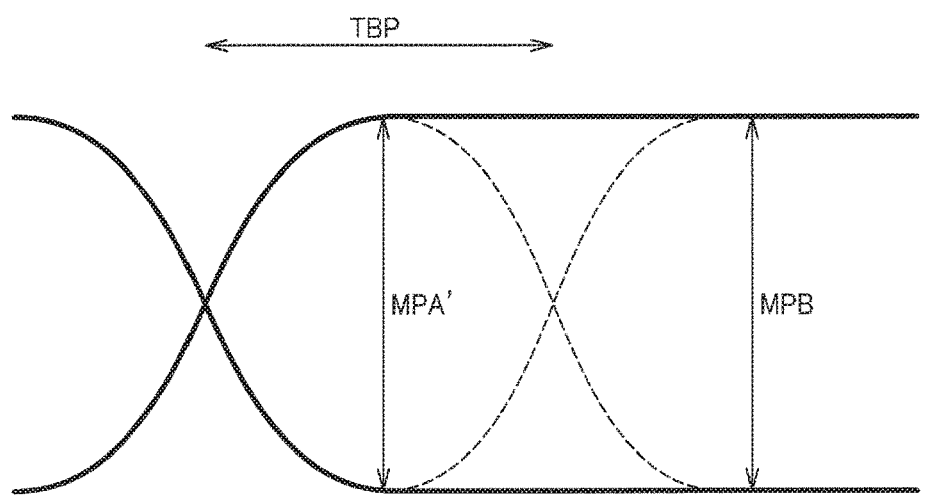
FIG. 4 shows an exemplary waveform of the transmission signal in the embodiment.

FIG. 4 shows an exemplary waveform of the transmission signal in the present embodiment. In the present embodiment, the drive current increases in the 1-bit period TBP after the logic level of the transmission signal is inverted, thus enabling the capacitance of a cable or the like to be charged using the increased drive current. The transition of the signal level is thereby steep, and even in the case where the logic level of the transmission signal is inverted again after the 1-bit period TBP (indicated with dotted lines), an amplitude MPA' of that transmission signal can be made to reach the peak magnitude MPB (includes approximate peak magnitude). Because electrical charge corresponding to the peak magnitude MPB is held using the capacitance of the cable or the like after the amplitude of the transmission signal has reached the peak magnitude MPB, it becomes possible to return the drive current to normal. By adopting this configuration, amplitude jitter in the eye pattern is reduced, enabling the characteristics of the eye pattern to be improved.

Also, according to the present embodiment, the current IDR from the current output circuit 110 is output to the first and second signal lines via the switch elements SWP and SWM. The number of switch timing relationships that affect the relationship between the timing at which the logic level of the transmission signal changes and the timing at which the drive current changes is (1×2=) two. That is, the first relationship is the relationship between the timing for switching the current IDR from the first current IA to the second current (IA+IB) and the timing for switching the switch element SWP from OFF to ON. The second relationship is the relationship between the timing for switching the current IDR from the first current IA to the second current (IA+IB) and the timing for switching the switch element SWM from OFF to ON. The timing relating to these two relationships (designs) need only be adjusted. For example, the timings need only be adjusted such that the current IDR switches from the first current IA to the second current (IA+IB), after the switch element SWP switches from OFF to ON. The switch element SWM switches from ON to OFF when the switch element SWP switches from OFF to ON, and realizing the above timing enables the current IDR to be prevented from increasing before the switch element SWM switches OFF. Similarly, the timings need only be adjusted such that the current IDR switches from the first current IA to the second current (IA+IB), after the switch element SWM switches from OFF to ON. As mentioned above, since the number of the timings to be taken into consideration is two, simplification of the timing adjustment can be achieved.

In this way, according to the present embodiment, the characteristics of the eye pattern can be improved by an increase in the drive current in the n-bit period after the logic level of the transmission signal is inverted, while reducing adverse effects on the quality of the transmission signal through simplification of the timing adjustment.

Also, in the present embodiment, the current output circuit 110 has a first current source ISA that outputs a first current IA to the first node N1, a second current source ISB that outputs a third current IB to the second node N2, and a third switch element SWE that is provided between the first node N1 and the second node N2.

By adopting this configuration, only the first current IA is output to the first node N1 as the current IDR when the third switch element SWE is OFF, and the first current IA and third current IB are output to the first node N1 as the current IDR when the third switch element SWE is ON. Accordingly, it becomes possible for the current output circuit 110 to output a second current (IA+IB) that is larger than the first current IA as the current IDR.

Also, in the present embodiment, the third switch element SWE is ON in the n-bit period after the logic level of the transmission signal is inverted. The second current that is output as the current IDR in that n-bit period is the current (IA+IB) obtained by adding the third current IB to the first current IA. Note that in the period until the logic level of the transmission signal is next inverted after the n-bit period, the third switch element SWE is OFF.

By adopting this configuration, in the n-bit period after the logic level of the transmission signal is inverted, the current output circuit 110 is able to output a second current (IA+IB) that is larger than the first current IA as the current IDR.

Also, in the present embodiment, n=1. That is, in the 1-bit period after the logic level of the transmission signal is inverted, the current output circuit 110 outputs a second current (IA+IB) that is larger than the first current IA as the current IDR.

As shown in FIG. 3, it is assumed that, after the logic level of the transmission signal is inverted, a large change in the signal level of the transmission signal will occur in the initial 1-bit period. Thus, it is thought that amplitude jitter in the eye pattern can be sufficiently reduced, by increasing the drive current in the 1-bit period after the logic level of the transmission signal is inverted. Also, generation of the control signal TGL that controls the increase in drive current can be simplified by realizing n=1. For example, reception data decoded from the reception signal can be converted to the control signal TGL, by utilizing the characteristics of an NRZI scheme or the like, as will be discussed later with FIGS. 10 and 11. Such conversion can be realized with very simple rules (e.g., logic reversal of reception data, etc.), by realizing n=1.

Also, in the present embodiment, the differential signal line is a differential signal line of a bus compliant with the USB standard.

In the case where the bus that is connected to the transmission circuit is USB, the transmission circuit and the USB receptacle (USB receptacle of transmission-side device including the transmission circuit) are connected to a cable or a harness, and that USB receptacle and the USB receptacle of the reception-side device are connected to a USB cable, for example. Since various cables, harnesses, and USB cables can be employed for such connections, the characteristics of the eye pattern of the transmission signal may be affected, as shown in FIG. 3. In this regard, according to the present embodiment, the characteristics of the eye pattern of the transmission signal can be improved, by increasing the drive current in the n-bit period after the logic level of the transmission signal is inverted.

Also, in the present embodiment, the transmission circuit 100 is a transmission circuit for HS (High Speed) mode of the USB standard.

As will be discussed later with FIGS. 10 and 11, in HS mode, the NRZI scheme and the bit-stuffing scheme are employed in the encoding of transmission signals. With the NRZI scheme and the bit-stuffing scheme, when a reception signal is decoded to generate reception data, and the reception data is encoded to generate a transmission signal, the reception signal and the transmission signal will be the same signal (signals corresponding to the same bit sequence). The timing at which the logic level of the transmission signal is inverted can thus be judged from the bit sequence of the reception data. Accordingly, when decoding a reception signal in packet analysis or the like to generate reception data, the control signal TGL can be generated from that reception data.

2. Modification

Figure 5:
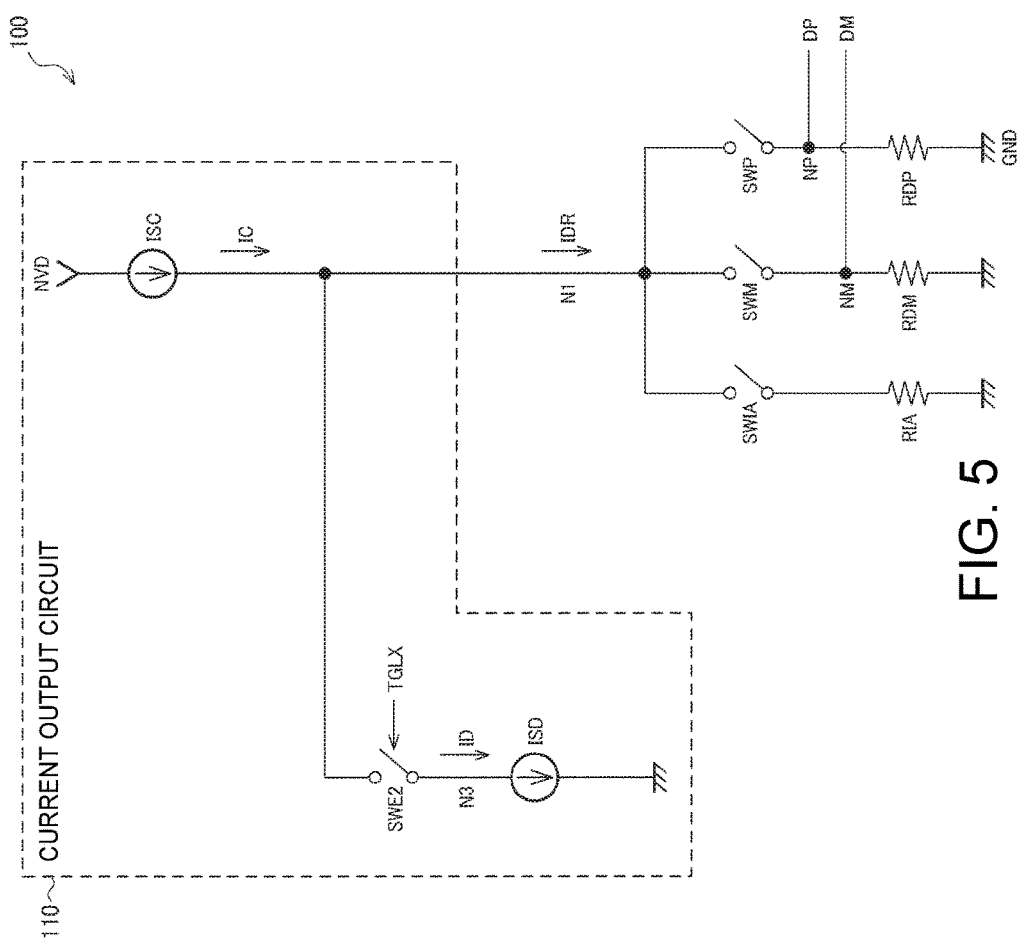
FIG. 5 shows a modification of the transmission circuit of the embodiment.

FIG. 5 shows a modification of the transmission circuit of the present embodiment. In FIG. 5, the current output circuit 110 includes current sources ISC and ISD (current source circuits) and a switch element SWE2.

The current source ISC outputs a current IC to the node N1. The current source ISD sends a current ID from a node N3 to the power supply node GND. That is, the current source ISD outputs a negative current ID to the node N3. Here, the currents IC and ID are currents having a positive current value, and IC>ID. For example, the current ID is set to be less than or equal to half of a current (IC-ID). The current sources ISC and ISD are constituted by current mirror circuits or the like, for example. The switch element SWE2 provided between the node N1 and the node N3. The switch element SWE2 is constituted by a transistor, and is an N-type transistor, for example.

ON and OFF of the switch element SWE2 is controlled by a control signal TGLX, and the switch element SWE2 is OFF in the n-bit period after the switch element SWP or the switch element SWM switches from OFF to ON. The switch element SWE2 is ON in other periods. The control signal TGLX is a logic inversion signal of the control signal TGL. The current IDR is IC when the switch element SWE2 is OFF, and the current IDR is IC-ID when the switch element SWE is ON. That is, the current IDR increases in the n-bit period. Note that current IC corresponds to IA+IB of FIG. 2, and the current IC-ID corresponds to IA in FIG. 2.

Note that the current output circuit 110 may also further include a resistor and a switch element that are connected in series between the node N3 and the power supply node NVD. This switch element is ON when the switch element SWE2 is OFF, and is OFF when the switch element SWE2 is ON.

Also, the current output circuit 110 may be configured such that the current ID can be variably set. For example, assume that the current source ISD is constituted by current sources ISDa to ISDc, and the switch element SWE2 is constituted by switch elements SWE2a to SWE2c. In this case, the current source ISDa and the switch element SWE2a are connected in series between the power supply node NVD and the node N1, the current source ISDb and the switch element SWE2b are connected in series between the power supply node NVD and the node N1, and the current source ISDc and the switch element SWE2c are connected in series between the power supply node NVD and the node N1. The current ID is then variably set by selecting one or a plurality of switch elements among the switch element SWE2a to SWE2c. The non-selected switch elements are OFF, and ON and OFF of the selected switch element is controlled by the control signal TGLX.

According to the above modification, the current output circuit 110 has a first current source (ISC) that outputs a second current (IC) to the first node N1, a third switch element (SWE2) that is provided between the first node N1 and a second node (N3), and a second current source (ISD) that sends a third current (ID) from the second node (N3) to a third node (power supply node GND).

By adopting this configuration, when the third switch element (SWE2) is ON, the second current (IC) is output to the first node N1 and the third current (ID) flows from the first node N1 to the third node (GND). When the third switch element (SWE2) is OFF, the second current (IC) is output to the first node N1. Accordingly, it becomes possible for the current output circuit 110 to output a second current (IC) that is larger than a first current (IC-ID) as the current IDR.

Also, in this modification, the third switch element (SWE2) is ON in the period from the end of the n-bit period after the logic level of the transmission signal is inverted until the logic level of the transmission signal is next inverted. The first current that is output as the current IDR in a period from the end of the n-bit period until the logic level of the transmission signal is next inverted is a current (IC-ID) obtained by subtracting the third current (ID) from the second current (IC).

By adopting this configuration, in the n-bit period after the logic level of the transmission signal is inverted, the current output circuit 110 becomes able to output a second current (IC) that is larger than the first current (IC-ID) as the current IDR.

3. Layout

Figure 6:
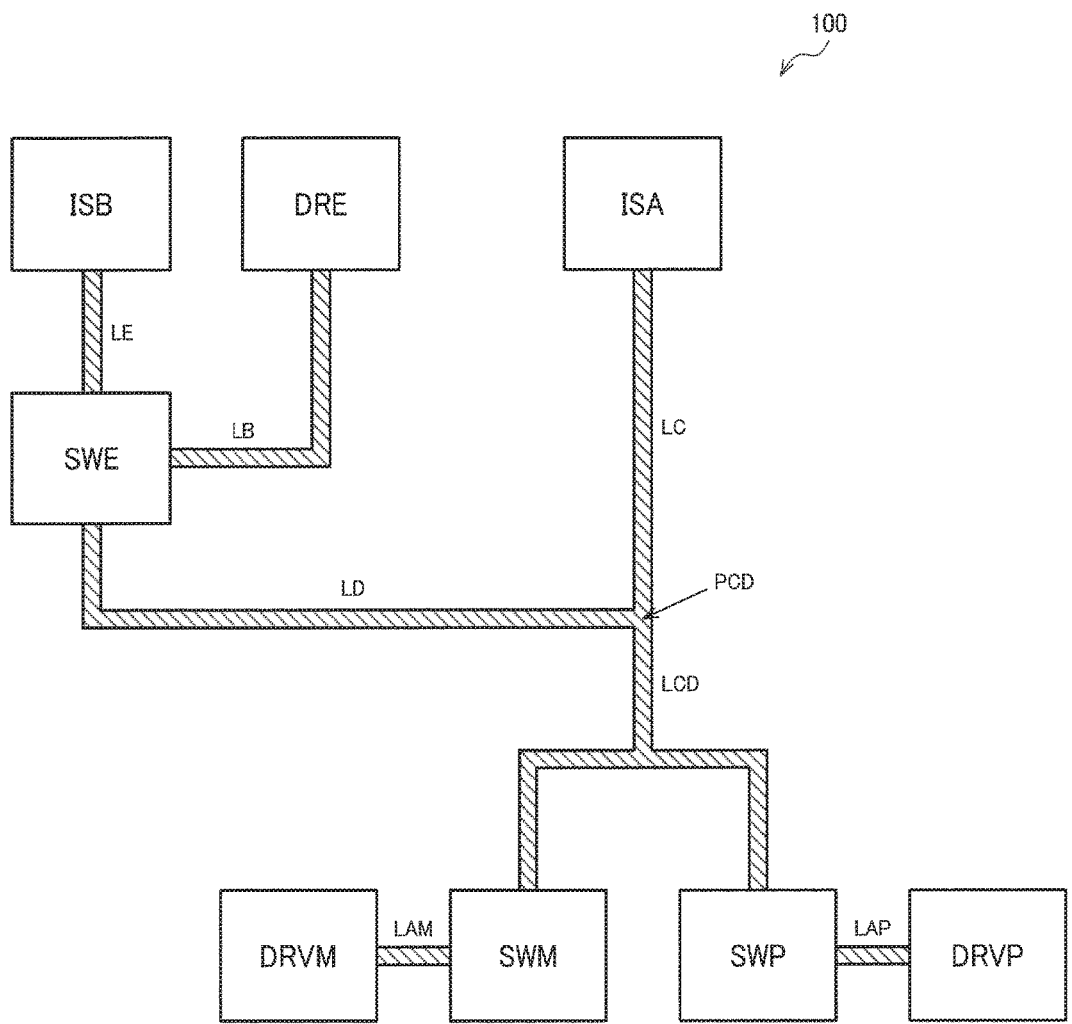
FIG. 6 shows an exemplary layout and placement of the transmission circuit.

FIG. 6 shows an exemplary layout and placement of the transmission circuit. Note that an exemplary placement for illustrating the relationship of the wiring length is shown in FIG. 6, and the placement need not necessarily be as shown in FIG. 6. That is, the transmission circuit need only be laid out such that a relationship of wiring length such as will be described below is satisfied.

The transmission circuit 100 is arranged (formed) on a substrate (semiconductor substrate) of an integrated circuit device. The current sources ISA and ISB, the switch elements SWE, SWP and SWM, and drivers DRE, DRVP and DRVM are arranged on the substrate. Also, wirings LC, LD, LCD and LE (current wirings) and wirings LB, LAP and LAM (drive wirings) are arranged on the substrate. These wirings are formed by a metal wiring (e.g., aluminum wiring) a via (e.g., tungsten via), and a contact.

The driver DRE is a driver that drives the switch element SWE. Similarly, the drivers DRVP and DRVM are drivers that respectively drive the switch elements SWP and SWM. One end of the wiring LB is connected to the output of driver DRE, and the other end of the wiring LB is connected to the gate of the transistor constituting the switch element SWE. Similarly, one end of the wirings LAP and LAM is respectively connected to the output of the drivers DRVP and DRVM, and the other end of the wirings LAP and LAM is respectively connected to the gate of the transistors constituting the switch elements SWP and SWM.

The length of the wirings LAP and LAM is the same, for example. This length is given as A. Also, the length of the wiring LB is given as B. At this time, B≥A. For example, the wirings LAP, LAM and LB are wired on the same wiring layer at the same wiring width. In the case where B≥A, a signal delay (parasitic resistance and parasitic capacitance of wiring) on the wiring LB will be greater than or equal to the signal delay on the wirings LAP and LAM. The timing at which the switch element SWE switches from OFF to ON can thus be shifted to a timing on or after the timing at which the switch elements SWP and SWM switch from OFF to ON.

One end of the wiring LC is connected to the output of the current source ISA, and one end of the wiring LD is connected to the source (or drain) of the transistor constituting the switch element SWE. The other end of the wiring LC is connected to the other end of the wiring LD, and the connection point thereof is referred to here as a junction PCD. The wiring LCD is a wiring that connects the drain (or source) of the junction PCD and the transistors constituting the switch elements SWP and SWM. One end of the wiring LE is connected to the output of the current source ISB, and the other end of the wiring LE is connected to the drain (or source) of the transistor constituting the switch element SWE.

The length of the wiring LC is given as C and the length of the wiring LD is given as D. At this time, D≥C. For example, the wirings LC and LD are wired on the same wiring layer at the same wiring width. In the case where D≥C, the signal delay on the wiring LD (time taken for the parasitic capacitance of the wiring to be charged by current) will be greater than or equal to the signal delay on the wiring LC. The timing at which the signal (current) reaches the junction PCD from the switch element SWE after the switch element SWE switches from OFF to ON can be shifted to on or after the timing at which the signal (current) reaches the junction PCD from the current source ISA after the switch elements SWP and SWM switch from OFF to ON.

Figure 7:
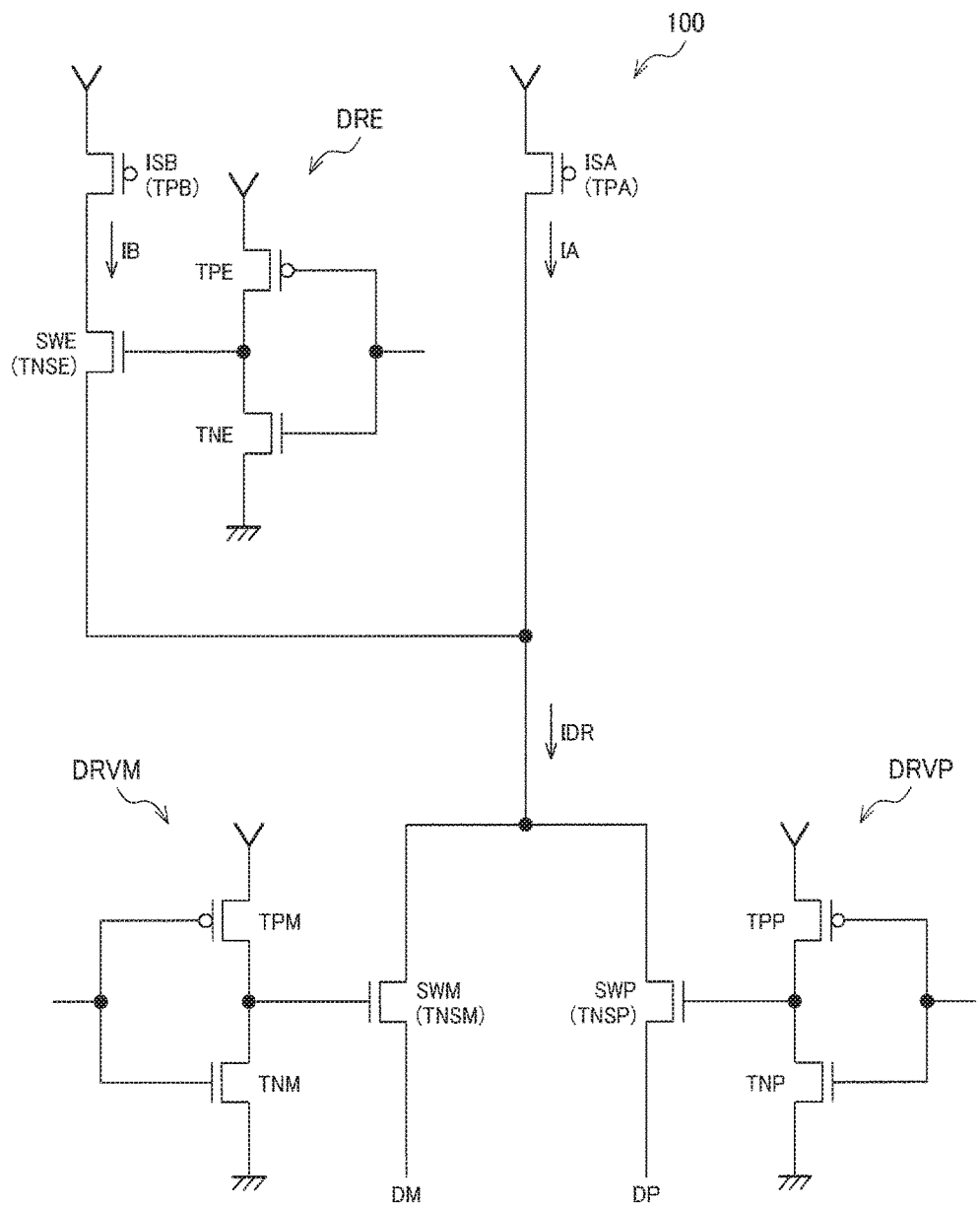
FIG. 7 shows a detailed exemplary configuration of the transmission circuit.

FIG. 7 shows a detailed exemplary configuration of the transmission circuit. In FIG. 7, the current source ISA is a P-type transistor TPA, and the current source ISB is a P-type transistor TPB. The P-type transistors TPA and TPB are transistors for mirroring the current in a current mirror circuit, and a bias voltage generated by the current mirror circuit is input to the gate thereof.

Also, in FIG. 7, the switch elements SWE, SWP and SWN are respectively N-type transistors TNSE, TNSP and TNSE. The driver DRE that drives TNSE is an inverter that is constituted by a P-type transistor TPE and an N-type transistor TNE. The driver DRVP that drives TNSP is an inverter that is constituted by a P-type transistor TPP and an N-type transistor TNP. The driver DRVM that drives TNSM is an inverter that is constituted by a P-type transistor TPM and an N-type transistor TNM.

Note that in FIG. 7, illustration of the resistors RDP, RDM, RIA and RIB and the switch elements SWIA and SWIB is omitted.

For example, the transistors TNSE, TNSP and TNSM are the same size (channel width (W) and channel length (L); gate area). Also, the drive capability (size (W/L) of the gate) of the P-type transistor TPE of the driver DRE is less than or equal to the drive capability of the P-type transistors TPP and TPM of the drivers DRVP and DRVM. The timing at which the switch element SWE (transistor TNSE) switches from OFF to ON can thus be shifted to on or after the timing at which the switch elements SWP and SWM (transistors TNSP and TNSM) switches from OFF to ON.

Note that although the drive capability is described here as being the size (W/L) of the gate of the transistor, the definition of the drive capability is not limited thereto. For example, the drive capability may be a ratio of the size (W/L) of the gate of the transistor of the driver and the gate area of the transistor driven by the driver.

According to the above embodiment, the transmission circuit 100 includes a first driver DRVP that drives ON and OFF of the first switch element SWP and a first drive wiring LAP that connects the first driver DRVP and the first switch element SWP. Also, the transmission circuit 100 includes a second driver DRVM that drives ON and OFF of the second switch element SWM and a second drive wiring LAM that connects the second driver DRVM and the second switch element SWM. Also, the transmission circuit 100 includes a third driver DRE that drives ON and OFF of the third switch element SWE and the third driver wiring LB that connects the third driver DRE and the third switch element SWE. And the length (B) of the third driver wiring LB is greater than or equal to the length (A) of the first drive wiring LAP and the length (A) of the second drive wiring LAM.

Figure 8:
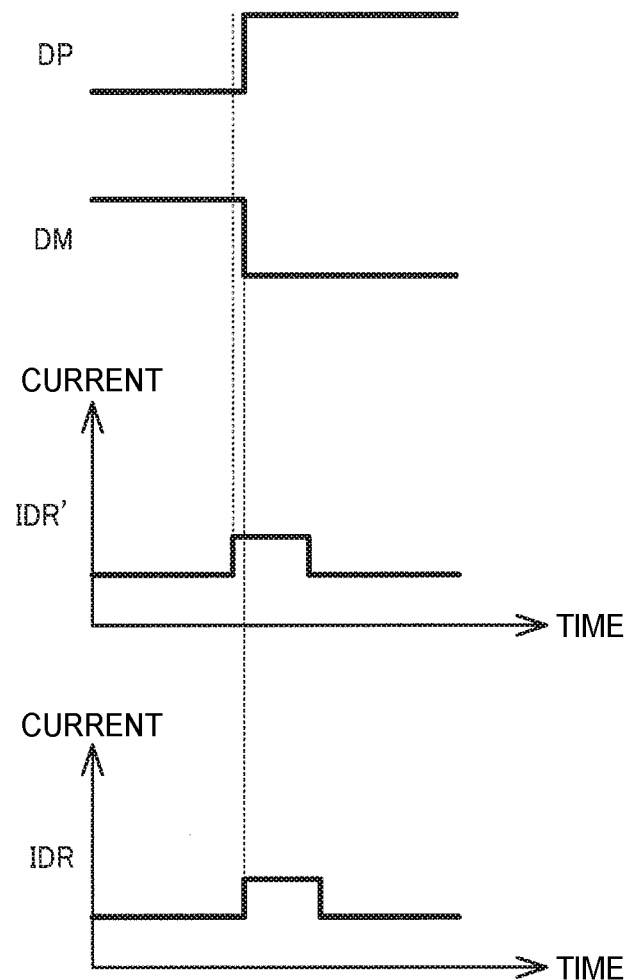
FIG. 8 is a diagram illustrating timing adjustment.

By adopting this configuration, the signal delay caused by the parasitic resistance or parasitic capacitance of the wiring LB will be greater than or equal to the signal delay caused by the parasitic resistance or parasitic capacitance of the wirings LAP and LAM. The timing at which the switch element SWE switches from OFF to ON can thus be shifted to on or after the timing at which the switch elements SWP and SWM switch from OFF to ON. For example, assume that the timing at which the current changes from the first current to the second current arrives before the timing at which the logic level of the transmission signal is inverted, such as a current IDR' shown in FIG. 8. For example, when the current IDR' increases before the timing at which the signal DM transitions from high level to low level as shown in FIG. 8, the signal level of the signal DM rises immediately before the signal DM transitions to low level, possibly affecting the quality of the transmission signal. In the present embodiment, the timing at which the current IDR changes from the first current to the second current is on or after the timing at which the logic level of the transmission signal is inverted, thus reducing the influence on the quality of the transmission signal.

Also, in the present embodiment, the transmission circuit 100 includes the first current wiring LC that is connected at one end to the first current source ISA and a second current wiring LD that is connected at one end to the third switch element SWE and connected at the other end to the other end of the first current wiring LC. Also, the length (C) of the first current wiring LC is longer than the length (D) of the second current wiring LD.

By adopting this configuration, the signal delay on the wiring LD (time taken for the parasitic capacitance of the wiring to be charged by current) will be greater than or equal to the signal delay on the wiring LC. The timing at which the signal (current) reaches the other end (PCD) of the wiring LD from the switch element SWE after the switch element SWE switches from OFF to ON can thus be shifted to on or after the timing at which the signal (current) reaches the other end (PCD) of the wiring LC from the current source ISA after the switch elements SWP and SWM switch from OFF to ON. As shown in FIG. 8, the timing at which the current IDR switches from the first current to the second current can thereby be shifted to on or after the timing at which the logic level of the transmission signal is inverted.

Also, in the present embodiment, the transmission circuit 100 includes the first driver DRVP, the second driver DRVM, and the third driver DRE. The first driver DRVP has a first ON-drive transistor (TPP) that drives the first switch element SWP from OFF to ON and a first OFF-drive transistor (TNP) that drives the first switch element SWP from ON to OFF. The second driver DRVM has a second ON-drive transistor (TPM) that drives the second switch element SWM from OFF to ON and a second OFF-drive transistor (TNM) that drives the second switch element SWM from ON to OFF. The third driver DRE has a third ON-drive transistor (TPE) that drives the third switch element SWE from OFF to ON and a third OFF-drive transistor (TNE) drive that drives the third switch element SWE from ON to OFF. The third ON-drive transistor (TPE) is smaller in size than the first ON-drive transistor (TPP) and the second ON-drive transistor (TPM). Note that the size of the transistors is W/L. Given the same L (channel length), the size of the transistors is W (channel width).

By adopting this configuration, the drive capability of the third ON-drive transistor (TPE) is less than or equal to the drive capability of the first and second ON-drive transistors (TPP, TPM). The timing at which the switch element SWE (transistor TNSE) switches from OFF to ON can thus be shifted to on or after the timing at which the switch elements SWP and SWM (transistors TNSP and TNSM) switches from OFF to ON. As shown in FIG. 8, the timing at which the current IDR switches from the first current to the second current can thereby be shifted to on or after the timing at which the logic level of the transmission signal is inverted.

4. First and Second Exemplary Configurations of Integrated Circuit Device

Figure 9:
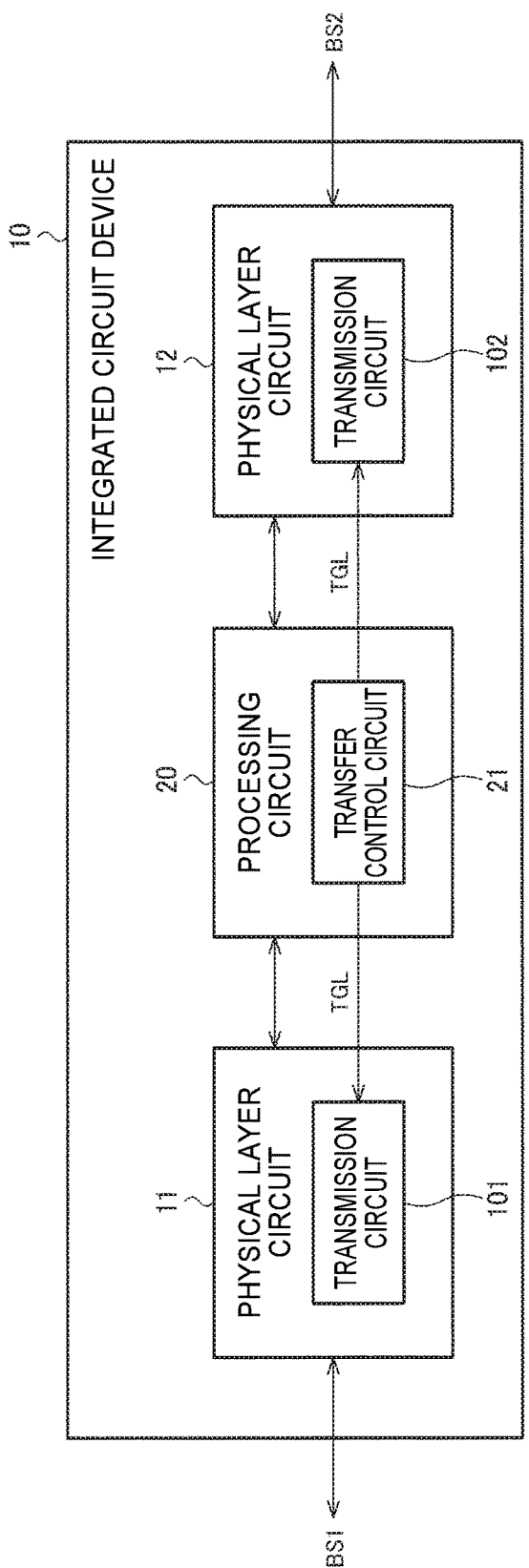
FIG. 9 shows a first exemplary configuration of an integrated circuit device.

FIG. 9 shows a first exemplary configuration of an integrated circuit device including the transmission circuit of the present embodiment. The integrated circuit device 10 (broadly, circuit device) includes a physical layer circuit 11 (first physical layer circuit), a physical layer circuit 12 (second physical layer circuit) and a processing circuit 20. Note that the integrated circuit device is not limited to the configuration in FIG. 9, and implementation of various modifications is possible, such omitting some of the constituent elements or adding other constituent elements. As the integrated circuit device 10 of configuration as shown in FIG. 9, a USB hub, for example, can be envisaged.

A bus BS1 (first bus) compliant with the USB standard (given serial communication standard) is connected to the physical layer circuit 11. A bus BS2 (second bus) compliant with the USB standard is connected to the physical layer circuit 12. The processing circuit 20 performs transfer processing for transmitting packets received from the bus BS1 via the physical layer circuit 11 to the bus BS2 via the physical layer circuit 12. Also, the processing circuit 20 performs transfer processing for transmitting packets received from the bus BS2 via the physical layer circuit 12 to the bus BS1 via the physical layer circuit 11.

The physical layer circuits 11 and 12 are each constituted by an analog circuit of a physical layer. The analog circuit of the physical layer is a transmission circuit for HS or FS, a reception circuit, any of various types of detection circuits, a pull-up resistor circuit or the like, for example. The physical layer circuit 11 includes a transmission circuit 101 as a transmission circuit for HS, and the physical layer circuit 12 includes a transmission circuit 102 as a transmission circuit for HS. The transmission circuits 101 and 102 correspond to the transmission circuit 100 of the present embodiment in FIG. 1 and the like. Note that a serial/parallel conversion circuit that converts serial data received via USB into parallel data, a parallel/serial conversion circuit that converts parallel data into serial data, and a circuit corresponding to a link layer such as an NRZI circuit are included in the processing circuit 20. A circuit corresponding to a link layer or the like of a USB transceiver macrocell, for example, is included in the processing circuit 20, and analog circuits such as a transmission circuit, a reception circuit and a detection circuit are included in the physical layer circuits 11 and 12.

The bus BS1 is a bus to which a main controller side, for example, is connected, and the bus BS2 is a bus to which a peripheral device side, for example, is connected. The present embodiment is, however, not limited to such a connection configuration. The buses BS1 and BS2 are buses compliant with the USB standard that include a signal line for the signals DP and DM (first and second signals) constituting the differential signal. The buses BS1 and BS2 can include a signal line for the power supplies VBUS and GND.

The processing circuit 20 is a circuit that performs transfer processing and various types of control processing, and can be realized by a logic circuit created by automatic placement and wiring such as a gate array. Note that the processing circuit 20 may be realized by a processor such as a CPU or an MPU. The processing circuit 20 includes a transfer control circuit 21 (repeater control circuit) that controls the transfer of packets. The transfer control circuit 21 performs packet analysis of received packets, and controls the start, end, stopping, resumption and the like of the transfer processing, based on this result. In the packet analysis, a reception signal encoded by a given encoding scheme is decoded and converted into reception data, and SOP detection, EOP detection, check for CRC error in packets, check for alignment error in packets, and the like, for example, are performed based on the reception data. In HS mode of the USB standard, the NRZI (Non Return to Zero Inversion) scheme and the bit-stuffing scheme are employed as the encoding scheme. The transfer control circuit 21 generates the control signal TGL (toggle control signal) from reception data, and outputs the control signal to the transmission circuits 101 and 102, using the conversion rule in this encoding.

Figure 10:
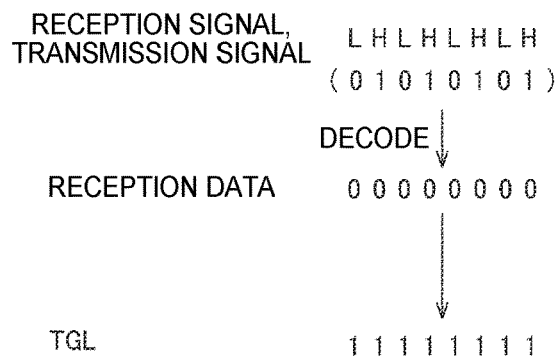
FIG. 10 is a diagram illustrating processing for generating a control signal.
Figure 11:
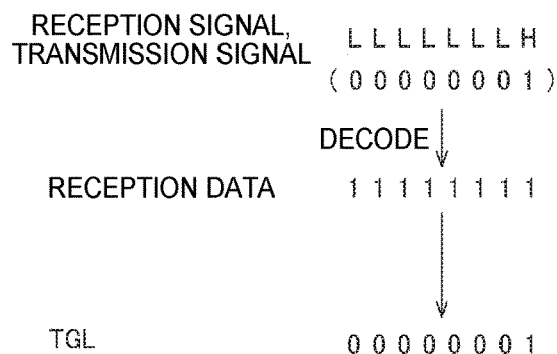
FIG. 11 is a diagram illustrating processing for generating a control signal.

FIGS. 10 and 11 are diagrams illustrating generation processing of the control signal TGL. As shown in FIG. 10, assume that "LHLHLHLH" has been received as a reception signal. "L" represents a low level ("K") and "H" represents a high level ("J"). The processing circuit 20 receives this reception signal as a bit sequence "01010101", and decodes that bit sequence into reception data having a bit sequence "00000000" using the NRZI scheme. The processing circuit 20, in the case where it is judged to transfer a packet based on packet analysis, converts the received bit sequence "01010101" into the transmission signal "LHLHLHLH", and transmits the transmission signal to a bus via a physical layer circuit. That is, in the NRZI scheme, the reception signal and the transmission signal will be the same signal. The bit period in which the logic level is inverted in the transmission signal "LHLHLHLH" can be judged from the bit sequence "00000000" of the reception data. In FIG. 10, the logic is inverted in all of the 8 bits, and thus the control signal TGL is a signal equivalent to a bit sequence "11111111". That is, in the 8-bit period in which the transmission circuit transmits the transmission signal "LHLHLHLH" to the bus, the control signal TGL is high level ("1"). The transfer control circuit 21 generates the bit sequence "11111111" of the control signal TGL by conversion that inverts the logic of the bit sequence "00000000" of the reception data.

As shown in FIG. 11, assume that "LLLLLLLH" has been received as the reception signal. The processing circuit 20 receives this reception signal as a bit sequence "00000001", and decodes that bit sequence into reception data having a bit sequence "11111111" using the NRZI scheme and the bit-stuffing scheme. The bit-stuffing scheme is a scheme that inverts the logic level in the case where the same logic level continues for a given number of bits (7 bits in HS mode). The reception signal and transmission signal will also be the same signal in the case where the NRZI scheme and the bit-stuffing scheme are used. In FIG. 11, the logic is inverted between the 7th bit and the 8th bit in the 8 bits of the transmission signal, and thus the control signal TGL is a signal equivalent to the bit sequence "00000001". The transfer control circuit 21 generates the bit sequence "00000001" of the control signal TGL, by inverting the logic of the bit sequence "11111111" of the reception data and further converting the logic from the 8th bit onward.

According to the above embodiment, the processing circuit 20 has the transfer control circuit 21 that performs packet analysis of packets and controls the transfer processing based on the result of the packet analysis. The transfer control circuit 21, in the packet analysis, decodes the first reception signal from the first bus BS1 to acquire reception data, and generates the control signal TGL from that reception data. The control signal TGL is, as described above, a control signal that causes the current output circuit 110 to output the second current in the n-bit period after the logic level of the transmission signal is inverted.

The NRZI scheme and the bit-stuffing scheme are encoding schemes in which data uniquely corresponds to the signal obtained by encoding the data. As illustrated with FIGS. 10 and 11, with such encoding schemes, the reception signal and the transmission signal will be the same signal (signals corresponding to the same bit sequence), and thus it is possible to find out the position (bit) at which the logic level of the transmission signal will be inverted from the reception data obtained by decoded the reception signal. Accordingly, it is possible to convert the reception data to generate the control signal TGL. For example, in the case of generating the control signal TGL from the transmission signal, it is possible to use the exclusive OR of a signal obtained by delaying the transmission signal by 1 bit and the original transmission signal as the control signal TGL. However, in order to synchronize the timing of the control signal TGL and the transmission signal with this technique, it is necessary to delay the transmission signal by 1 bit. In the present embodiment, the control signal TGL can be generated through conversion of the reception data, and thus such a delay does not need to be added.

Figure 12:
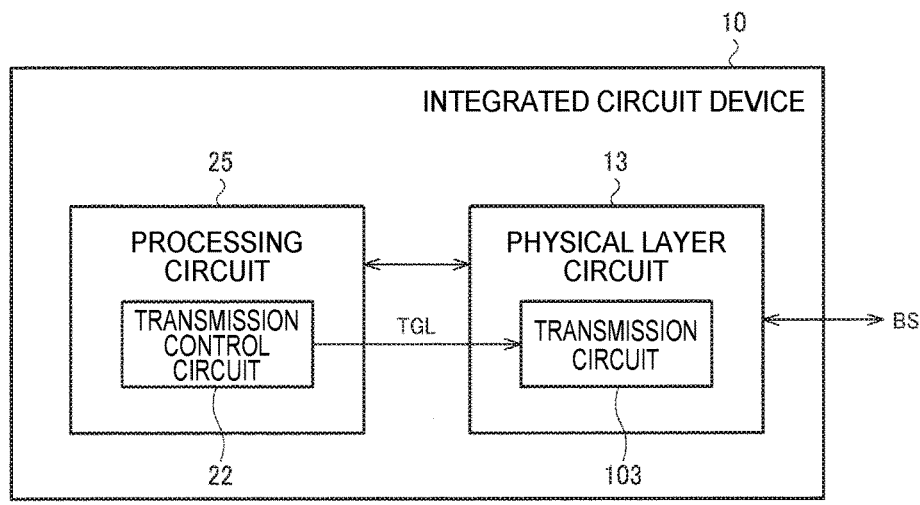
FIG. 12 is a second exemplary configuration of an integrated circuit device.

FIG. 12 shows a second exemplary configuration of an integrated circuit device including the transmission circuit of the present embodiment. In FIG. 12, the integrated circuit device 10 includes a physical layer circuit 13 and a processing circuit 25. As the integrated circuit device 10 of a configuration as shown in FIG. 12, a USB host (main controller) or a USB device (peripheral device), for example, can be envisaged.

The processing circuit 25 transmits packets to bus BS via the physical layer circuit 13. The physical layer circuit 13 includes the transmission circuit 103, and the transmission circuit 103 outputs the transmission signal to the differential signal line of the bus BS. The transmission circuit 103 corresponds to the transmission circuit 100 in FIG. 1 and the like. Also, the processing circuit 25 receives packets from the bus BS via the physical layer circuit 13. The processing circuit 25 includes a transmission control circuit 22, and the transmission control circuit 22 encodes transmission data using the NRZI scheme and the bit-stuffing scheme, and transmits the transmission signal acquired by the encoding to the bus BS via the physical layer circuit 13. The transmission control circuit 22 generates the control signal TGL with a technique similar to the technique described with FIGS. 10 and 11. That is, in the case where the bit sequence of the transmission data is "00000000", that bit sequence is encoded as a bit sequence "01010101" using the NRZI scheme. A transmission signal "LHLHLHLH" corresponding to that bit sequence is then transmitted. In this case, the transmission control circuit 22 generates the bit sequence "11111111" of the control signal TGL through conversion that inverts the logic of the bit sequence "00000000" of transmission data. Also, in the case where the bit sequence of transmission data is "11111111", that bit sequence is encoded as a bit sequence "00000001" using the NRZI scheme and the bit-stuffing scheme. A transmission signal "LLLLLLLH" corresponding to that bit sequence is then transmitted. In this case, the transmission control circuit 22 generates the bit sequence "00000001" of the control signal TGL through conversion that inverts the logic of the bit sequence "11111111" of the transmission data and further inverts the logic from the 8th bit onward.

According to the above embodiment, the processing circuit 25 has the transmission control circuit 22, and the transmission control circuit 22 encodes transmission data, and transmits the encoded transmission signal to the bus BS via the physical layer circuit 13. The transmission control circuit 22 generates the control signal TGL that causes the current output circuit 110 to output the second current in the n-bit period after the logic level of the transmission signal is inverted from the transmission data.

As described above, with the NRZI scheme and the bit-stuffing scheme, data uniquely corresponds to the signal obtained by encoding the data. It is possible thus to find out the position (bit) at which the logic level of the transmission signal will be inverted from the transmission data. Accordingly, it is possible to convert the transmission data and to generate the control signal TGL.

5. Third Exemplary Configuration of Integrated Circuit Device

Figure 13:
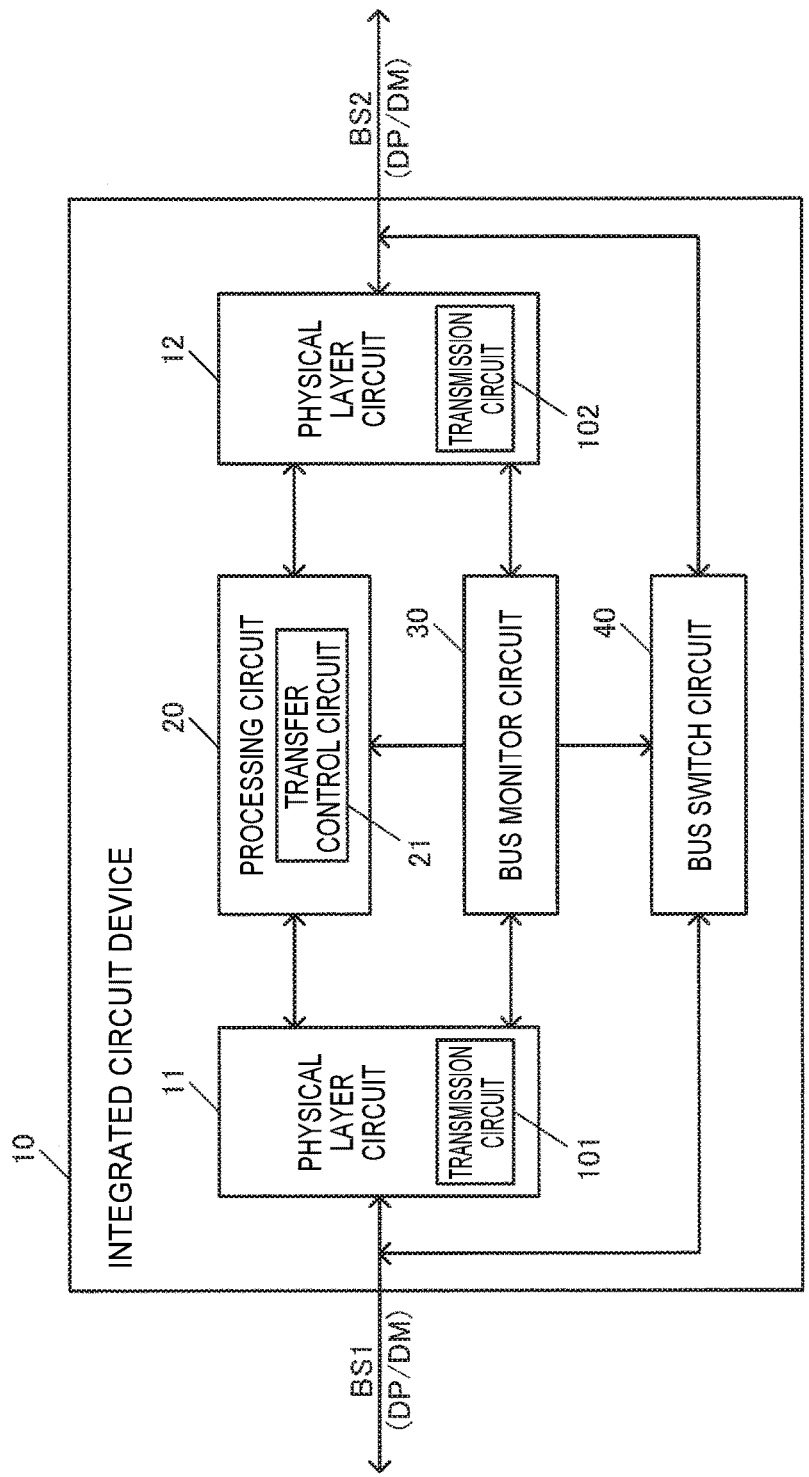
FIG. 13 is a third exemplary configuration of an integrated circuit device.

FIG. 13 shows a third exemplary configuration of an integrated circuit device that includes the transmission circuit of the present embodiment. The integrated circuit device 10 includes physical layer circuits 11 and 12, a processing circuit 20, a bus monitor circuit 30, and a bus switch circuit 40. The physical layer circuits 11 and 12 respectively include transmission circuits 101 and 102. The processing circuit 20 includes the transfer control circuit 21. Note that the same reference signs are given to constituent elements that are the same as constituent elements described above, and description of those constituent elements is omitted as appropriate.

The processing circuit 20 can further include a link layer circuit, a repeater circuit, or the like. The link layer circuit is a circuit that performs processing corresponding to a link layer. The link layer circuit performs processing such as serial/parallel conversion processing for converting serial data received by USB, for example, into parallel data, serial/parallel conversion processing for converting parallel data into serial data for transmission, and processing for NRZI encoding and decoding. The repeater circuit performs logic processing for transmitting packets received from the bus BS1 side to the bus BS2 side, and transmitting packets received from the bus BS2 side to the bus BS1 side. For example, each bit of a received packet is sampled using a clock signal, and serial data obtained by the sampling is converted into parallel data. Parallel data that has undergone various types of logic processing such as NRZI is then converted into serial data, and the serial data is transmitted in synchronous with the clock signal within the integrated circuit device 10. By adopting this configuration, resynchronization of the bits of the packet is realized.

The bus monitor circuit 30 performs a monitor operation on the buses BS1 and BS2. The bus monitor circuit 30 performs a monitor operation that involves monitoring the state of (at least one of) the bus BS1 and the bus BS2, based on the signal from (at least one of) the physical layer circuit 11 and the physical layer circuit 12, for example. The bus switch circuit 40 then switches the connection (electrical connection) between the bus BS1 and the bus BS2 to ON or OFF, based on a result of the monitoring by the bus monitor circuit 30. That is, the bus switch circuit 40 electrically connects and electrically disconnects the bus BS1 and the bus BS2. Switching the connection between the bus BS1 and the bus BS2 to ON or OFF (electrically connecting and electrically disconnecting the buses BS1 and BS2) involves switching switch elements (first and second switch elements) or the like that are provided between the signal line for DP and DM of the bus BS1 and the signal line for DP and DM of the bus BS2, for example, to ON or OFF.

Figure 14:
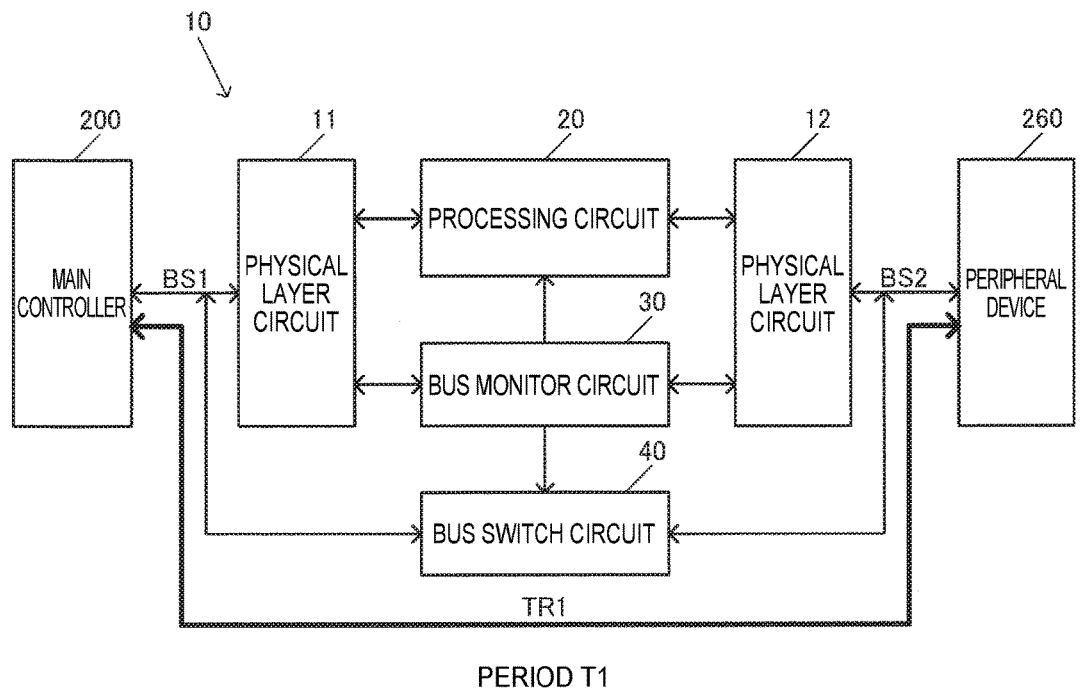
FIG. 14 is a diagram illustrating operations of the integrated circuit device of the third exemplary configuration.

Specifically, as shown in FIG. 14, the period in which the bus switch circuit 40 switches the connection between the bus BS1 and the bus BS2 to ON is given as a period T1 (first period). That is, in the period T1, the switch elements of the bus switch circuit 40 that are provided between the bus BS1 and the bus BS2 are ON. A main controller 200 (broadly, first device) that is connected to the bus BS1 and a peripheral device 260 (broadly, second device) that is connected to the bus BS2 are thereby able to perform signal transmission by USB directly using the USB bus.

Figure 15:
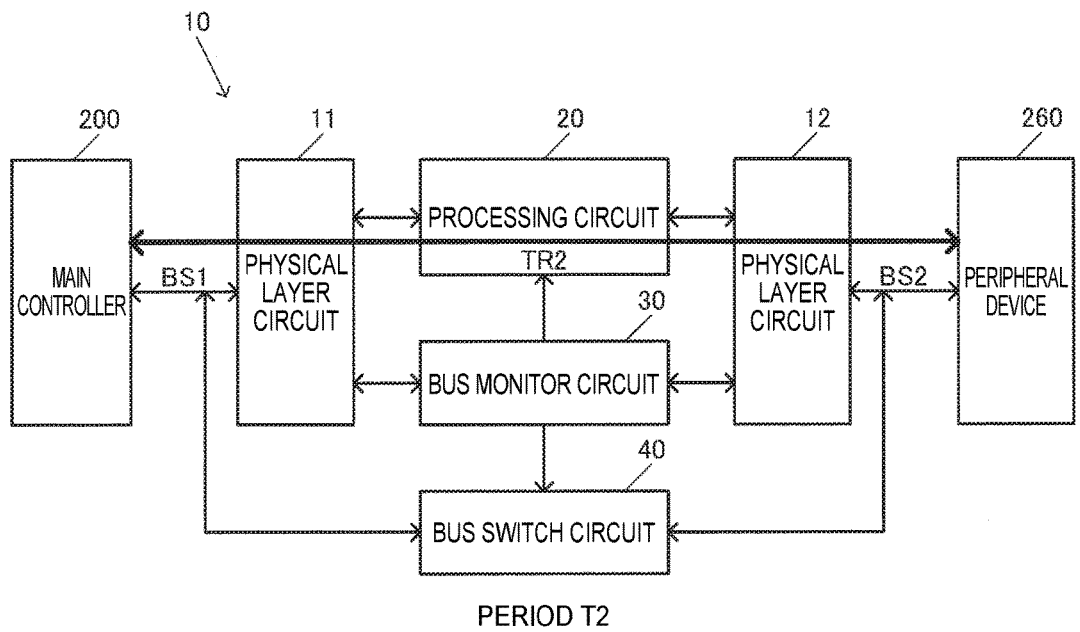
FIG. 15 is a diagram illustrating operations of the integrated circuit device of the third exemplary configuration.

Also, as shown in FIG. 15, the period in which the bus switch circuit 40 switches the connection between the bus BS1 and the bus BS2 to OFF is given as a period T2 (second period). That is, in the period T2, the switch elements of the bus switch circuit 40 that are provided between the bus BS1 and the bus BS2 are OFF. The processing circuit 20 performs the above transfer processing in (at least part of) the period T2. That is, the processing circuit 20, in the period T2, performs transfer processing for transferring packets received from the bus BS1 via the physical layer circuit 11 to the bus BS2 via the physical layer circuit 12, and transferring packets received from the bus BS2 via the physical layer circuit 12 to the bus BS1 via the physical layer circuit 11. Resynchronization of the bits of the packets is thereby performed, enabling high quality signal transfer in which degradation of the signal characteristics of USB transmission signals is improved to be realized.

Specifically, the bus monitor circuit 30 performs switch control of the bus switch circuit 40. That is, the bus monitor circuit 30, in the period T1, switches the connection between the bus BS1 and the bus BS2 to ON using the bus switch circuit 40. For example, the bus monitor circuit 30, in the period T1, activates the switch control signal of the switch elements of the bus switch circuit 40 to switch the switch elements to ON. Also, the bus monitor circuit 30, in the period T2, switches the connection between the bus BS1 and the bus BS2 to OFF using the bus switch circuit 40, and cause transfer processing to be performed by the processing circuit 20. For example, the bus monitor circuit 30, in the period T2, deactivates the switch control signal of the switch elements of the bus switch circuit 40, and switches the switch elements to OFF. Also, the bus monitor circuit 30 activates an instruction signal (permission signal) for instructing the processing circuit 20 to perform transfer processing.

In the present embodiment, the ON/OFF switch timings of the connection between the bus BS1 and the bus BS2 (switch timings of periods T1 and T2) are set to timings within a predetermined range. That is, when the host side (main controller) starts reset, the device side sends out a device chirp K. The connection between the bus BS1 and the bus BS2 switches from ON to OFF, at least after the start timing of this device chirp K (switches from period T1 to T2). Alternatively, when a fixed time period elapses after the device chirp K, the device side stops the device chirp K, and the host side executes a host chirp K/J. The connection between the bus BS1 and the bus BS2 switches from ON to OFF, at least after the end timing of the host chirp K/J. The device side, upon detecting the host chirp K/J, switches HS termination to ON and shifts to HS mode. The device side then shifts to HS idol when the host side ends the reset, and the host side starts sending out an SOF. After at least the start timing of the device chirp K, for example, and before the start timing of SOF transmission, for example, the connection between the bus BS1 and the bus BS2 switches from ON to OFF, and the transfer processing on a transmission path TR2 in FIG. 15 switches from OFF to ON.

Also, in the present embodiment, in the case where the host starts reset in HS mode, the USB switch switches from OFF to ON, and the transfer processing of the processing circuit 20 switches from ON to OFF. That is, in the case where reset is performed, the bus switch circuit 40 switches the connection between the bus BS1 and the bus BS2 from OFF to ON, and the processing circuit 20 stops the transfer processing. For example, the host side shifts to the FS mode after starting reset, and in the case where 3 ms or more has elapsed after the packet has left the bus, the USB switch switches from OFF to ON. In the present embodiment, the USB switch also switches from OFF to ON and the transfer processing of the processing circuit 20 also switches from ON to OFF, in the case where the host starts suspension. That is, in the case where suspension is performed, the bus switch circuit 40 switches the connection between the bus BS1 and the bus BS2 from OFF to ON, and the processing circuit 20 stops the transfer processing. For example, the host side shifts to the FS mode after starting suspension, and in the case where 3 ms or more has elapsed after the packet has left the bus, the USB switch switches from OFF to ON.

6. Physical Layer Circuit

Figure 16:
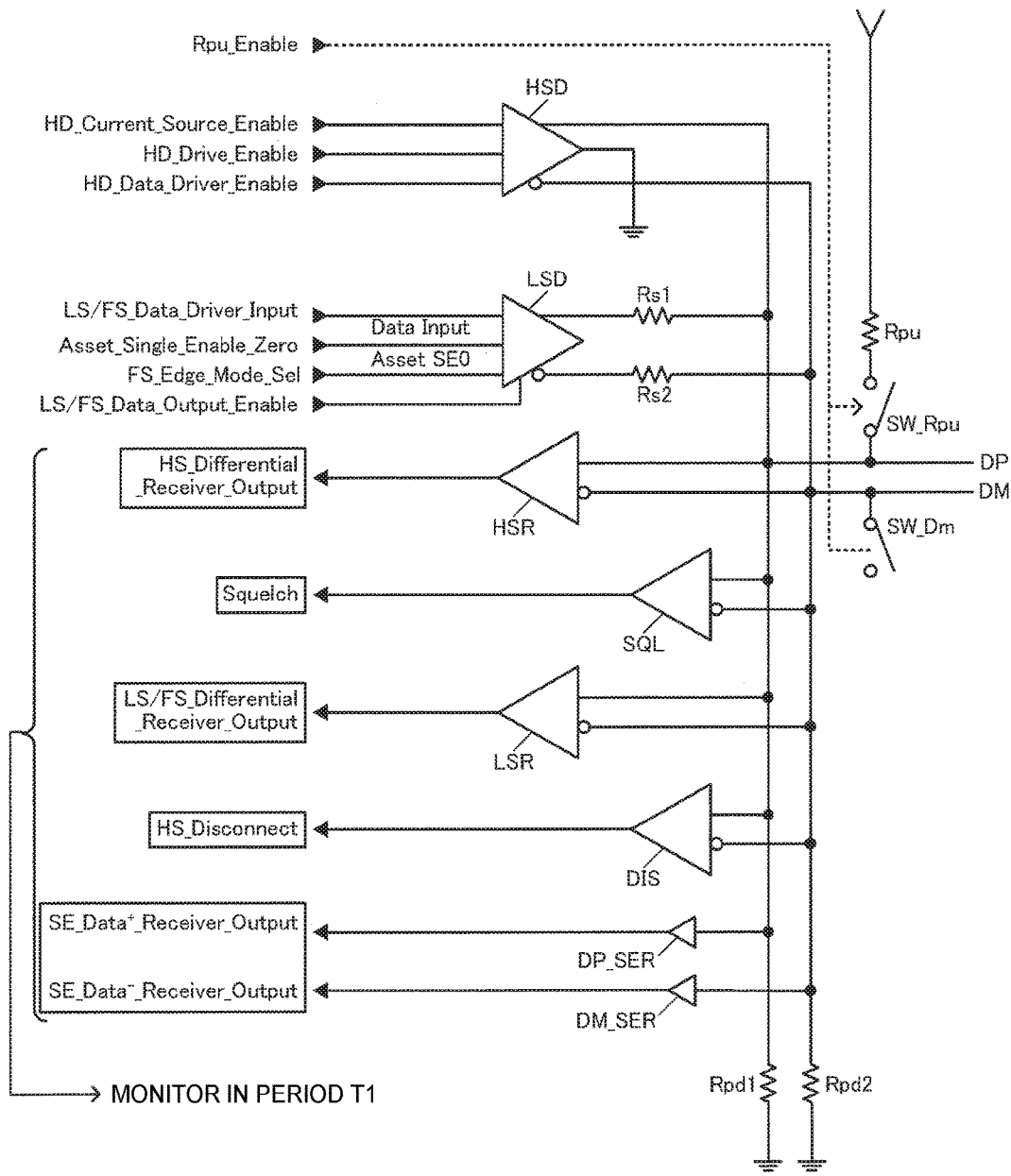
FIG. 16 is an exemplary configuration of a physical layer circuit.

FIG. 16 shows an exemplary configuration of a physical layer circuit (11, 12). The physical layer circuit includes a pull-up resistor Rpu, switch elements SW_Rpu and SW_Dm, and pull-down resistors Rpd1 and Rpd2. The switch element SW_Rpu is switched to ON or OFF based on a control signal Rpu_Enable. A pull-down operation is thereby realized. Also, the physical layer circuit includes a transmission circuit HSD (current driver) for HS mode, a transmission circuit LSD (driver) for LS/FS modes, and resistors Rs1 and Rs2. Also, the physical layer circuit includes a differential reception circuit HSR (data receiver) for HS mode, a squelch detection circuit SQL (transmission envelope detector), a differential reception circuit LSR for LS/FS modes (data receiver), a disconnection detection circuit DIS (disconnection envelope detector), and single end reception circuits DP_SER and DM_SER (receivers).

Note that the transmission circuit 100 (101, 102, 103) of the present embodiment corresponds to the transmission circuit HSD for HS mode.

In the present embodiment, the monitor operation of the bus by the bus monitor circuit 30 is performed, based on signals from the analog circuits constituting the physical layer circuit. Specifically, as shown in FIG. 16, the bus monitor circuit 30 performs the monitor operation on the bus, based on signals from the differential reception circuit HSR for HS mode, the squelch detection circuit SQL, the differential reception circuit LSR for LS/FS modes, the disconnection detection circuit DIS or the single-ended reception circuits DP_SER and DM_SER, for example. That is, the bus monitor circuit 30 is able to monitor the respective states of the bus such as device chirp K, host chirp K/J, idle, reset, suspension, resume, SEO, J, K, bus reset and HS disconnection, based on the signals from such analog circuits. The bus monitor circuit 30 then performs processing such as control for switching the switch elements (USB switch, BC switch) of the bus switch circuit 40 to ON or OFF based on the monitoring result and control for shifting the transfer processing of the processing circuit 20 to ON or OFF. By adopting this configuration, appropriate switch control of the bus switch circuit 40 and transfer control of the processing circuit 20 in which the state of the bus is appropriately judged can be realized.

7. Electronic Device

Figure 17:
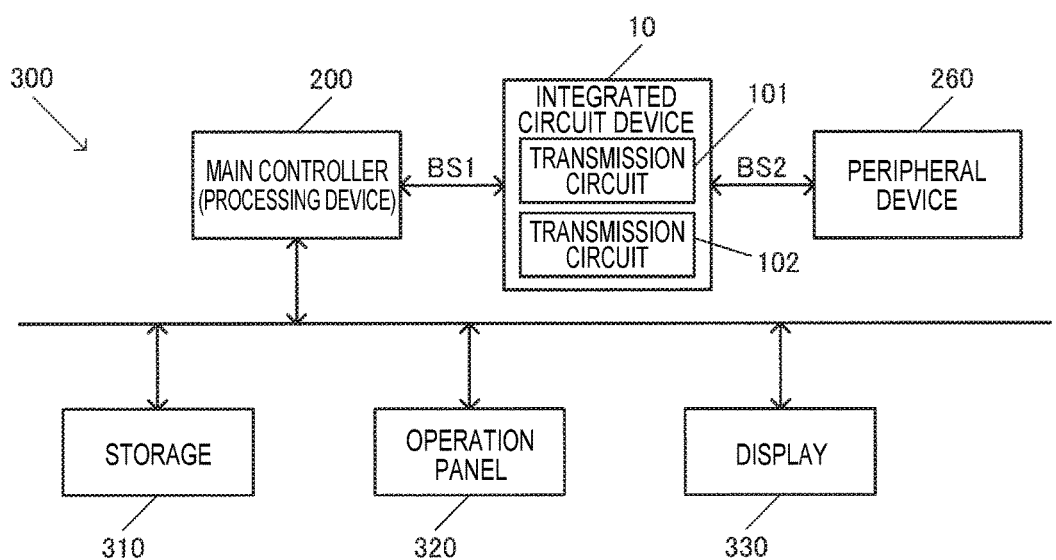
FIG. 17 is an exemplary configuration of an electronic device.

FIG. 17 shows an exemplary configuration of an electronic device that includes the transmission circuit (integrated circuit device) of the present embodiment. This electronic device 300 includes an integrated circuit device 10 and a main controller 200 (broadly, processing unit). The integrated circuit device 10 includes transmission circuits 101 and 102 of the present embodiment. A main controller 200 is connected to a bus BS1. For example, the main controller 200 and the integrated circuit device 10 are connected via the bus BS1. Also, a peripheral device 260 is connected to a bus BS2 of the integrated circuit device 10.

The main controller 200 (processing unit) is realized by a processor such as a CPU or an MPU, for example. Alternatively, the main controller 200 may be realized by various types of ASIC circuit devices. Also, the main controller 200 may be realized by a circuit board on which a plurality of circuit devices (ICs) and circuit components are mounted. A portable terminal device or the like, for example can be envisaged as the peripheral device 260, but is not limited thereto. The peripheral device 260 may be a wearable device or the like.

The electronic device 300 is further able to include a storage 310, an operation panel 320, and a display 330. The storage 310 stores data, and the function thereof can be realized by a semiconductor memory such as RAM or ROM, an HDD (hard disk drive) or the like. The operation panel 320 is for a user to perform input operations, and can be realized by an operation device such as an operation button or a touch panel display. The display 330 displays various types of information, and can realize by a display such as a liquid crystal display or an organic EL display. Note that in the case where a touch panel display is used as the operation panel 320, this touch panel display will doubly function as the operation panel 320 and the display 330.

As the electronic device 300 that is realized by the present embodiment, various devices can be envisaged including, for example, an in-vehicle device, a printing apparatus, projection apparatus, a robot, a head-mounted display device, a biological information measurement device, a measurement device that measures a physical quantity such as distance, time, flow velocity and flow amount, a network-related device such as a base station or a router, content provider that distributes content or a video device such a digital camera or a video camera.

Note that although the present embodiment has been described in detail above, a person skilled in the art will appreciate that numerous modifications can be made without substantially departing from the novel matter and effects of the invention. Accordingly, all such modifications are intended to be embraced within the scope of the invention. For example, terms that appear in the description or drawings at least once together with other broader or synonymous terms can be replaced by those other terms in any part of the description or drawings. Also, the configurations and operations of the transmission circuit, the integrated circuit device and the electronic device are not limited to those described in the embodiment, and implementation of various modifications is possible.

This application claims priority from Japanese Patent Application No. 2017-163934 filed in the Japanese Patent Office on Aug. 29, 2017, the entire disclosure of which is hereby incorporated by reference in its entirely.

What is claimed is:

1. A transmission circuit for transmitting a transmission signal via a first signal line and a second signal line that constitute a differential signal line, comprising:
a current output circuit configured to output a current to a first node;
a first switch element provided between the first node and the first signal line; and
a second switch element provided between the first node and the second signal line,
wherein the first and second signal lines are separate from each other such that the first and second signal lines are not in electrical communication with each other,
wherein when the transmission signal is at a first logic level, the first switch element is ON, the second switch element is OFF, and the first signal line is driven by the current from the current output circuit,
when the transmission signal is at a second logic level, the first switch element is OFF, the second switch element is ON, and the second signal line is driven by the current from the current output circuit,
in an n-bit period (where n is an integer greater than or equal to 1) after a logic level of the transmission signal is inverted, the current output circuit outputs a second current that is larger than a first current as the current, and
in a period until the logic level is next inverted after the n-bit period, the current output circuit outputs the first current as the current.

2. The transmission circuit according to claim 1,
wherein the current output circuit has:
a first current source configured to output the first current to the first node;
a second current source configured to output a third current to a second node; and
a third switch element provided between the first node and the second node.

3. The transmission circuit according to claim 2,
wherein the third switch element is ON in the n-bit period, and
the second current is a current obtained by adding the third current to the first current.

4. The transmission circuit according to claim 2, comprising:
a first driver configured to drive ON and OFF of the first switch element;
a first drive wiring connecting the first driver and the first switch element;
a second driver configured to drive ON and OFF of the second switch element;
a second drive wiring connecting the second driver and the second switch element;
a third driver configured to drive ON and OFF of the third switch element; and
a third drive wiring connecting the third driver and the third switch element,
wherein the third drive wiring is greater than or equal in length to the first drive wiring and the second drive wiring.

5. The transmission circuit according to claim 2, comprising:
a first current wiring connected at one end to the first current source; and
a second current wiring connected at one end to the third switch element and connected at the other end to the other end of the first current wiring,
wherein the first current wiring is greater in length than the second current wiring.

6. The transmission circuit according to claim 2, comprising:
a first driver having a first ON-drive transistor configured to drive the first switch element from OFF to ON, and a first OFF-drive transistor configured to drive the first switch element from ON to OFF;
a second driver having a second ON-drive transistor configured to drive the second switch element from OFF to ON, and a second OFF-drive transistor configured to drive the second switch element from ON to OFF; and
a third driver having a third ON-drive transistor configured to drive the third switch element from OFF to ON, and a third OFF-drive transistor configured to drive the third switch element from ON to OFF,
wherein the third ON-drive transistor is smaller in size than the first ON-drive transistor and the second ON-drive transistor.

7. The transmission circuit according to claim 1,
wherein the current output circuit has:
a first current source configured to output the second current to the first node;
a third switch element provided between the first node and a second node; and
a second current source configured to send a third current from the second node to the third node.

8. The transmission circuit according to claim 7,
wherein the third switch element is ON in a period until the logic level is next inverted after the n-bit period, and
the first current is a current obtained by subtracting the third current from the second current.

9. The transmission circuit according to claim 1,
wherein n=1.

10. The transmission circuit according to claim 1,
wherein the differential signal line is a differential signal line of a bus compliant with a USB (Universal Serial Bus) standard.

11. The transmission circuit according to claim 10,
wherein the transmission circuit is a transmission circuit for HS (High Speed) mode of the USB standard.

12. An integrated circuit device comprising the transmission circuit according to claim 1.

13. The integrated circuit device according to claim 12, comprising:

a first physical layer circuit to which a first bus compliant with the USB standard is connected;

a second physical layer circuit having the transmission circuit and to which a second bus compliant with the USB standard and constituted by the differential signal line is connected; and a processing circuit configured to perform transfer processing for transmitting a packet received from the first bus via the first physical layer circuit to the second bus via the second physical layer circuit, wherein the processing circuit has a transfer control circuit configured to perform packet analysis of the packet and control the transfer processing based on a result of the packet analysis, and the transfer control circuit, in the packet analysis, decodes a reception signal from the first bus to acquire reception data, and generates, from the reception data, a control signal for causing the current output circuit to output the second current in the n-bit period.

14. The integrated circuit device according to claim 12, comprising:

a physical layer circuit having the transmission circuit and to which a bus compliant with the USB standard and constituted by the differential signal line is connected; and a processing circuit configured to transmit a packet to the bus via the physical layer circuit, wherein the processing circuit has a transmission control circuit configured to encode transmission data and transmit a transmission signal obtained from the encoding to the bus via the physical layer circuit, and the transmission control circuit generates, from the transmission data, a control signal for causing the current output circuit to output the second current in the n-bit period.

15. An electronic device comprising the transmission circuit according to claim 1.

* * * * *